(12) United States Patent
Zhang et al.

(10) Patent No.: US 11,450,773 B2
(45) Date of Patent: Sep. 20, 2022

(54) THIN FILM TRANSISTOR, METHOD OF FABRICATING THIN FILM TRANSISTOR, AND DISPLAY APPARATUS HAVING THIN FILM TRANSISTOR

(71) Applicants: Chengdu BOE Optoelectronics Technology Co., Ltd., Sichuan (CN); BOE Technology Group Co., Ltd., Beijing (CN)

(72) Inventors: Shun Zhang, Beijing (CN); Bo Cheng, Beijing (CN); Kai Zhang, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 184 days.

(21) Appl. No.: 16/626,322

(22) PCT Filed: May 5, 2019

(86) PCT No.: PCT/CN2019/085561
§ 371 (c)(1),
(2) Date: Dec. 24, 2019

(87) PCT Pub. No.: WO2020/140357
PCT Pub. Date: Jul. 9, 2020

(65) Prior Publication Data
US 2021/0336068 A1    Oct. 28, 2021

(30) Foreign Application Priority Data
Jan. 2, 2019   (CN) .......................... 201910001678.4

(51) Int. Cl.
*H01L 29/786* (2006.01)
*H01L 29/423* (2006.01)
*H01L 29/66* (2006.01)

(52) U.S. Cl.
CPC .. *H01L 29/78696* (2013.01); *H01L 29/42392* (2013.01); *H01L 29/6675* (2013.01);
(Continued)

(58) Field of Classification Search
CPC ......... H01L 29/78696; H01L 29/78633; H01L 29/42392; H01L 29/6675; H01L 29/66969;
(Continued)

(56) References Cited

U.S. PATENT DOCUMENTS 6,291,863 B1    9/2001   Chan
2011/0193077 A1*  8/2011  Yamazaki ......... H01L 21/02565
                                                       257/43
(Continued)

FOREIGN PATENT DOCUMENTS

CN    105633171 A    6/2016
CN    106935657 A    7/2017
(Continued)

OTHER PUBLICATIONS

International Search Report & Written Opinion dated Oct. 22, 2019, regarding PCT/CN2019/085561.
(Continued)

*Primary Examiner* — Jonathan Han
(74) *Attorney, Agent, or Firm* — Intellectual Valley Law, P.C.

(57) ABSTRACT

A thin film transistor is provided. The thin film transistor includes a base substrate; a first target layer on the base substrate; a first insulating layer on a side of the first target layer away from the base substrate; an intermediate layer on
(Continued)

a side of the first insulating layer away from the first target layer; a second insulating layer on a side of the intermediate layer away from the first insulating layer; and a second target layer on a side of the second insulating layer away from the intermediate layer. The first target layer is electrically connected to the second target layer. The intermediate layer is one of a gate electrode and an active layer, and the first target layer and the second target layer together constitute another one of the gate electrode and the active layer.

20 Claims, 14 Drawing Sheets

(52) U.S. Cl.
CPC .. *H01L 29/66969* (2013.01); *H01L 29/78633* (2013.01); *H01L 29/7869* (2013.01); *H01L 29/78663* (2013.01); *H01L 29/78672* (2013.01)

(58) Field of Classification Search
CPC ........... H01L 29/7869; H01L 29/78672; H01L 29/78663
See application file for complete search history.

(56) References Cited

U.S. PATENT DOCUMENTS

| | | | |
|---|---|---|---|
| 2016/0149052 | A1* | 5/2016 | Ahn .................. H01L 29/78663 438/157 |
| 2018/0013007 | A1* | 1/2018 | Sato ...................... H01L 29/423 |
| 2018/0053858 | A1 | 2/2018 | Tian |
| 2018/0190931 | A1 | 7/2018 | Jung et al. |
| 2018/0294314 | A1 | 10/2018 | Liu et al. |
| 2019/0131461 | A1 | 5/2019 | Chen et al. |

FOREIGN PATENT DOCUMENTS

| | | |
|---|---|---|
| CN | 107154407 A | 9/2017 |
| CN | 107210013 A | 9/2017 |
| CN | 107845674 A | 3/2018 |
| CN | 108010850 A | 5/2018 |
| CN | 108269855 A | 7/2018 |

OTHER PUBLICATIONS

First Office Action in the Chinese Patent Application No. 201910001678. 4, dated Apr. 9, 2020; English translation attached.

* cited by examiner

THIN FILM TRANSISTOR, METHOD OF FABRICATING THIN FILM TRANSISTOR, AND DISPLAY APPARATUS HAVING THIN FILM TRANSISTOR

CROSS-REFERENCE TO RELATED APPLICATION

This application is a national stage application under 35 U.S.C. § 371 of International Application No. PCT/CN2019/085561, filed May 5, 2019, which claims priority to Chinese Patent Application No. 201910001678.4, filed Jan. 2, 2019, the contents of which are incorporated by reference in the entirety.

TECHNICAL FIELD

The present invention relates to display technology, more particularly, to a thin film transistor, a method of fabricating a thin film transistor, and a display apparatus having a thin film transistor.

BACKGROUND

A thin film transistor is disposed on a base substrate of a display apparatus to drive subpixels to emit light. For example, a thin film transistor includes an active layer, a gate insulating layer, a gate electrode, a source electrode connected with the active layer, and a drain electrode connected with the active layer. An orthographic projection of the active layer on the base substrate partially overlaps with an orthographic projection of the gate electrode on the base substrate. A region of the active layer having an orthographic projection on the base substrate covered by the orthographic projection of the gate electrode on the base substrate is a channel region of the active layer. The driving capacity of a thin film transistor is positive correlated with a ratio of a width of the channel region to a length of the channel region. One way to enhance the driving capacity of a thin film transistor is to increase the ratio of the width of the channel region to the length of the channel.

SUMMARY

In one aspect, the present invention provides a thin film transistor, comprising a base substrate; a first target layer on the base substrate; a first insulating layer on a side of the first target layer away from the base substrate; an intermediate layer on a side of the first insulating layer away from the first target layer; a second insulating layer on a side of the intermediate layer away from the first insulating layer; and a second target layer on a side of the second insulating layer away from the intermediate layer; wherein the first target layer is electrically connected to the second target layer; an orthographic projection of the intermediate layer on the base substrate at least partially overlaps with an orthographic projection of the first target layer on the base substrate; the orthographic projection of the intermediate layer on the base substrate at least partially overlaps with an orthographic projection of the second target layer on the base substrate; and the intermediate layer is one of a gate electrode and an active layer, and the first target layer and the second target layer together constitute another one of the gate electrode and the active layer.

Optionally, the orthographic projection of the intermediate layer on the base substrate is covered by the orthographic projection of the first insulating layer on the base substrate; and the orthographic projection of the intermediate layer on the base substrate is covered by the orthographic projection of the second insulating layer on the base substrate.

Optionally, the thin film transistor further comprises one or more vias extending through both the first insulating layer and the second insulating layer; wherein the first target layer is electrically connected to the second target layer through the one or more vias.

Optionally, the one or more vias comprises a first via and a second via respectively extending through both the first insulating layer and the second insulating layer; the intermediate layer is between the first via and the second via; and the first via and the second via are symmetrically arranged with respect to the intermediate layer.

Optionally, the second target layer comprises a first portion and a second portion; the second portion of the second target layer is in the one or more vias; and the first portion of the second target layer and the first target layer respectively have a bar shape extending along a first direction.

Optionally, the intermediate layer has a bar shape extending along the first direction or a second direction that is perpendicular to the first direction.

Optionally, the intermediate layer has the bar shape extending along the second direction; the first target layer has a first length along the first direction and a first width along the second direction; the first portion of the second target layer has a second length along the first direction and a second width along the second direction; the intermediate layer has a third width along the first direction, and a third length along the second direction; the first width of the first target layer is substantially the same as the second width of the first portion of the second target layer; and the third length of the intermediate layer is greater than the first width of the first target layer and greater than the second width of the first portion of the second target layer.

Optionally, the intermediate layer is the gate electrode; the first target layer and the second target layer together constitute the active layer; and the second width of the first portion of the second target layer is smaller than the third width of the intermediate layer.

Optionally, the intermediate layer is the gate electrode; and the first target layer and the second target layer are the active layer; and the thin film transistor further comprises a source electrode electrically connected to one of the first target layer and the second target layer, and a drain electrode electrically connected to one of the first target layer and second target layer.

Optionally, the intermediate layer is the active layer; the first target layer and the second target layer together constitute the gate electrode; and the thin film transistor further comprises a source electrode and a drain electrode both electrically connected to the intermediate layer.

In another aspect, the present invention provides a method of fabricating a thin film transistor comprising forming a first target layer on a base substrate; forming a first insulating layer on a side of the first target layer away from the base substrate; forming an intermediate layer on a side of the first insulating layer away from the first target layer; forming a second insulating layer on a side of the intermediate layer away from the first insulating layer; and forming a second target layer on a side of the second insulating layer away from the intermediate layer; wherein the first target layer is electrically connected to the second target layer; an orthographic projection of the intermediate layer on the base substrate at least partially overlaps with an orthographic projection of the first target layer on the base substrate; the orthographic projection of the intermediate layer on the base substrate at least partially overlaps with an orthographic projection of the second target layer on the base substrate; and the intermediate layer is one of a gate electrode and an active layer, and the first target layer and the second target layer constitute another one of the gate electrode and the active layer.

Optionally, the orthographic projection of the intermediate layer on the base substrate is covered by the orthographic projection of the first insulating layer on the base substrate; and the orthographic projection of the intermediate layer on the base substrate is covered by the orthographic projection of the second insulating layer on the base substrate.

Optionally, prior to forming the second target layer, the method of fabricating a thin film transistor further comprises forming one or more vias extending through both the first insulating layer and the second insulating layer to partially expose a surface of the first target layer away from the base substrate; wherein the second target layer is formed on the side of the second insulating layer away from the first insulating layer; and the second target layer is formed to extend through the first insulating layer and the second insulating layer through the one or more vias to connect to the first target layer.

Optionally, forming the one or more vias comprises forming a first via and a second via respectively extending through both the first insulating layer and the second insulating layer; the intermediate layer is between the first via and the second via; and the first via and the second via are symmetrically arranged with respect to the intermediate layer.

Optionally, the intermediate layer is a gate electrode; and the first target layer and the second target layer together constitute the active layer. Optionally, the method further comprises performing ion doping to the first target layer. Optionally, subsequent to forming the intermediate layer, the method further comprises performing ion doping to a region of the first target layer having an orthographic projection on the base substrate uncovered by the orthographic projection of the intermediate layer on the base substrate; and performing ion doping to the second target layer.

Optionally, subsequent to performing ion doping to the second target layer, the method further comprises forming a third insulating layer on a side of the second target layer away from the second insulating layer; forming a shielding layer on a side of the third insulating layer away from the second target layer, an orthographic projection of the shielding layer on the base substrate substantially overlapping the orthographic projection of the intermediate layer; and performing ion doping to a region of the second target layer having an orthographic projection on the base substrate uncovered by the orthographic projection of the shielding layer on the base substrate.

Optionally, the intermediate layer is the active layer; and the first target layer and the second target layer together constitute the gate electrode. Optionally, the method further comprises performing ion doping to the intermediate layer. Optionally, subsequent to forming the second target layer, the method further comprises performing ion doping to a region of the intermediate layer having an orthographic projection on the base substrate uncovered by the orthographic projection of the second target layer on the base substrate.

Optionally, the ion doping is a boron ion doping.

Optionally, the intermediate layer is a gate electrode; and the first target layer and the second target layer together constitute the active layer. Optionally, the method further comprises forming a source electrode electrically connected to one of the first target layer and the second target layer; and forming a drain electrode electrically connected to one of the first target layer and the second target layer.

Optionally, the intermediate layer is the active layer; and the first target layer and the second target layer together constitute the gate electrode. Optionally, the method further comprises forming a source electrode and a drain electrode both electrically connected to the intermediate layer.

In another aspect, the present invention provides a display apparatus having a thin film transistor comprising a display substrate having a thin film transistor described herein.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1A:
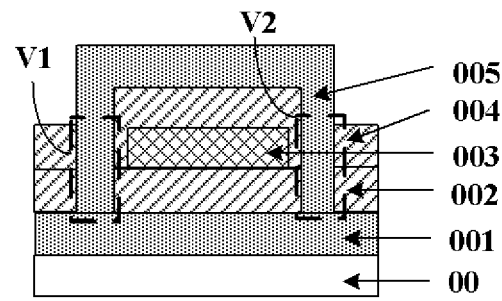
FIG. 1A is a schematic diagram of a structure of a thin film transistor in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Increasing the ratio of the width of the channel region to the length of the channel region results in an increase of a size of the thin film transistor, for example, an area of the orthographic projection of the thin film transistor on the base substrate is increased due to the increase of the ratio of the width of the channel region to the length of the channel region. The size-increased thin film transistor will neither benefit the design a narrow frame display panel, nor benefit a display panel having high resolution.

Accordingly, the present disclosure provides, inter alia, a thin film transistor, a method of fabricating a thin film transistor, and a display apparatus having a thin film transistor that substantially obviate one or more of the problems due to limitations and disadvantages of the related art. In one aspect, the present disclosure provides a thin film transistor. In some embodiments, the thin film transistor includes a base substrate; a first target layer on the base substrate; a first insulating layer on a side of the first target layer away from the base substrate; an intermediate layer on a side of the first insulating layer away from the first target layer; a second insulating layer on a side of the intermediate layer away from the first insulating layer; and a second target layer on a side of the second insulating layer away from the intermediate layer. Optionally, the first target layer is electrically connected to the second target layer. Optionally, an orthographic projection of the intermediate layer on the base substrate at least partially overlaps with an orthographic projection of the first target layer on the base substrate. Optionally, the orthographic projection of the intermediate layer on the base substrate at least partially overlaps with an orthographic projection of the second target layer on the base substrate. Optionally, the intermediate layer is one of a gate electrode and an active layer, and the first target layer and the second target layer together constitute another one of the gate electrode and the active layer.

As used herein, the term "partially overlap" refers to two orthographic projections at least 1%, e.g., at least 5%, at least 10%, at least 20%, at least 30%, at least 40%, at least 50%, at least 60%, at least 70%, at least 80%, or at least 90%, overlapping with each other. For example, the orthographic projection of the intermediate layer on the base substrate at least partially overlaps with 1% of an orthographic projection of the first target layer on the base substrate.

In some embodiments, in a thin film transistor, an orthographic projection of an active layer on a base substrate partially overlaps with an orthographic projection of a gate electrode on the base substrate. A region of the active layer having an orthographic projection on the base substrate covered by the orthographic projection of the gate electrode on the base substrate is a channel region of the active layer.

Optionally, both the active layer and the gate electrode have a bar structure. A width of the active layer is perpendicular to a width of the gate electrode. The width of the active layer is smaller than the width of the gate electrode. So, the channel region of the active layer has a width substantially the same as the width of the active layer, and has a length substantially the same as the width of the gate electrode.

FIG. 1A is a schematic diagram of a structure of a thin film transistor in some embodiments according to the present disclosure. Referring to FIG. 1A, in some embodiments, a thin film transistor includes a base substrate 00; a first target layer 001 on the base substrate 00; a first insulating layer 002 on a side of the first target layer 001 away from the base substrate 00; an intermediate layer 003 on a side of the first insulating layer 002 away from the first target layer 001; a second insulating layer 004 on a side of the intermediate layer 003 away from the first insulating layer 002; and a second target layer 005 on a side of the second insulating layer 004 away from the intermediate layer 003.

Optionally, the first target layer 001 is electrically connected to the second target layer 005.

Optionally, an orthographic projection of the intermediate layer 003 on the base substrate 00 at least partially overlaps with an orthographic projection of the first target layer 001 on the base substrate 00. Optionally, the orthographic projection of the intermediate layer 003 on the base substrate 00 at least partially overlaps with an orthographic projection of the second target layer 005 on the base substrate 00.

Optionally, the intermediate layer 003 is one of a gate electrode and an active layer, and the first target layer 001 and the second target layer 005 together constitute another one of the gate electrode and the active layer. In one example, the intermediate layer 003 is the gate electrode, the first target layer 001 and the second target layer 005 together constitute the active layer. In another example, the intermediate layer 003 is the active layer, the first target layer 001 and the second target layer 005 together constitute the gate electrode.

In some embodiments, an orthographic projection of the active layer on the base substrate partially overlaps with an orthographic projection of the gate electrode on the base substrate. A region of the active layer having an orthographic projection on the base substrate covered by the orthographic projection of the gate electrode on the base substrate is a channel region of the active layer.

Figure 1B:
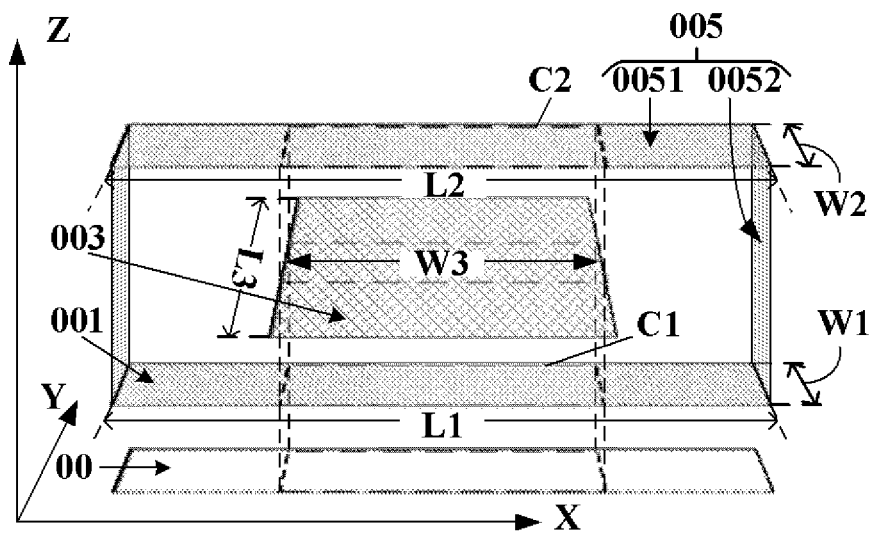
FIG. 1B is a schematic diagram of a structure of a thin film transistor in some embodiments according to the present disclosure.

FIG. 1B is a schematic diagram of a structure of a thin film transistor in some embodiments according to the present disclosure. Referring to FIG. 1A and FIG. 1B, in some embodiment, the intermediate layer 003 is the gate electrode, the first target layer 001 and the second target layer 005 together constitute the active layer.

Optionally, the first target layer has a first width W1 along a second direction Y. Optionally, the second target layer has a second width W2 along the second direction Y. Optionally, the intermediate layer has a third width W3 along the first direction X. Optionally, the second direction Y is perpendicular to the first direction X.

Optionally, the orthographic projection of the intermediate layer 003 (e.g. the gate electrode) on the base substrate 00 at least partially overlaps with the orthographic projection of the first target layer 001 (e.g. the active layer) on the base substrate 00. A region of the first target layer 001 (e.g. the active layer) having an orthographic projection on the base substrate 00 covered by the orthographic projection of the intermediate layer (e.g. the gate electrode) on the base substrate 00 is a first channel region C1 of the first target layer 001.

Optionally, the orthographic projection of the intermediate layer 003 on the base substrate 00 at least partially overlaps with the orthographic projection of the second target layer 005 (e.g. the active layer) on the base substrate 00. A region of the second target layer 005 (e.g. the active layer) having an orthographic projection on the base substrate 00 covered by the orthographic projection of the intermediate layer (e.g. the gate electrode) on the base substrate 00 is a second channel region C2 of the second target layer 005.

Optionally, the first channel region C1 of the first target layer 001 and the second channel region C2 of the second target layer 005 encircles the intermediate layer 003.

As used herein, the term "encircle" refers to "to pass completely around." The term encircle is not limited to mean literally forming a circle, although it may include forming a circle, but may also include entirely or partially forming a perimeter around, entirely or partially surrounding, and/or being located at near an entire or partial periphery of that which is being encircled.

Optionally, a width of the channel region of the thin film transistor shown in FIG. 1A and FIG. 1B is a value of a sum of a first channel width of the first channel region C1 and a second channel width of the second channel region C2. Optionally, since the channel region of the active layer has a width substantially the same as the width of the active layer, the first channel width of the first channel region C1 is substantially the same as the first width W1 of the first target layer 001. The second channel width of the second channel region is substantially the same as the second width W2 of the second target layer 005. For example, the width of the channel region of the thin film transistor is a value of a sum of the first width W1 of the first target layer 001 and the second width W2 of a second target layer 005.

Optionally, since the channel region of the active layer has a length substantially the same as the width of the gate electrode, a length of the channel region of the thin film transistor shown in FIG. 1A and FIG. 1B is the width of the gate electrode. Optionally, the length of the channel region of the thin film transistor is the third width W3 of the intermediate layer 003.

Optionally, the ratio of the width of the channel region to the length of the channel region can maintain in a relative greater value, even though the first width W1 of the first target layer 001 or the second width W2 of the second target layer 005 is reduced. For example, the ratio of the width of the channel region to the length of the channel region can maintain, when the first width W1 of the first target layer 001 and the second width W2 of the second target layer 005 are reduced to half of a width of a channel region of a conventional thin film transistor.

By reducing the first width W1 of the first target layer 001 or the second width W2 of the second target layer 005, the size of thin film transistor in a plane parallel to the base substrate 00 is reduced without weakening the driving capacity of the thin film transistor.

Figure 2:
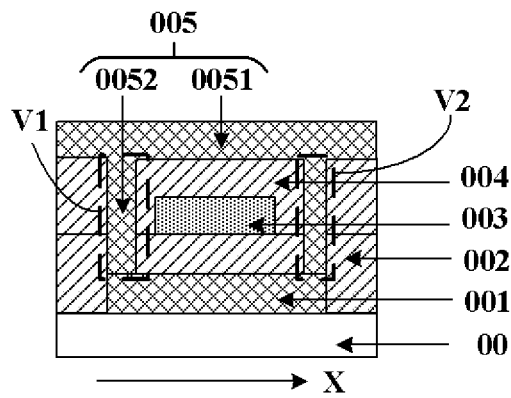
FIG. 2 is a schematic diagram illustrating a structure of a thin film transistor in some embodiments according to the present disclosure.

FIG. 2 is a schematic diagram illustrating a structure of a thin film transistor in some embodiments according to the present disclosure. Referring to FIG. 2, in some embodiments, the intermediate layer 300 is the active layer. The first target layer 001 and the second target layer 005 together constitute the gate electrode. Optionally, the gate electrode (e.g. the first target layer 001 and the second target layer 005) encircles the active layer (e.g. the intermediate layer 003), resulting the active layer between two gate sub-electrodes of the gate electrode. For example, the two gate sub-electrodes are the first target layer 001 and the second target layer 005. The two gate sub-electrodes together drive the active layer 003, which may enhance the driving capacity of the thin film transistor.

In some embodiments, the thin film transistor described herein can be used in a gate driver on array (GOA) circuit to fabricate a display apparatus having a narrow frame and high resolution. Optionally, the thin film transistor described herein can be a thin film transistor used in a gate integral circuit (Gate IC) to fabricate a display apparatus having a narrow frame and high resolution.

In some embodiments, the thin film transistor has a first target layer, a first insulating layer, an intermediate layer, a second insulating layer, and a second target layer sequentially stacked on a base substrate. In some embodiments, the first target layer and the second target layer together constitute one of an active layer and a gate electrode.

In one example, the first target layer and the second target layer together constitute the active layer, to form a first channel region of the first target layer and the second channel region of the second target layer encircling the intermediate layer (e.g. the gate electrode). A width of the channel region of the thin film transistor is a value of a sum of a first channel width of the first channel region and a second channel width of the second channel region, e.g. the width of the channel region of the thin film transistor is a value of a sum of the first width of the first target layer and the second width of a second target layer. The ratio of the width of the channel region to the length of the channel region can maintain in a relative greater value, even though the first width of the first target layer or the second width of the second target layer is reduced. By reducing the first width of the first target layer or the second width of the second target layer, the size of thin film transistor in a plane parallel to the base substrate is reduced without weakening the driving capacity of the thin film transistor.

In another example, the first target layer and the second target layer together constitute the gate electrode, to encircle the intermediate layer (e.g. the active layer), resulting the active layer between two gate sub-electrodes of the gate electrode. The two gate sub-electrodes (e.g. the first target layer and the second target layer) together drive the active layer, which may enhance the driving capacity of the thin film transistor.

In some embodiments, the thin film transistor described herein can enhance the driving capacity without increasing the size of thin film transistor in a plane parallel to the base substrate, and the thin film transistor described herein can be used to fabricate a display apparatus having a narrow frame and high resolution.

In some embodiments, Referring to FIG. 1A, the orthographic projection of the intermediate layer 003 on the base substrate 00 is covered by the orthographic projection of the first insulating layer 002 on the base substrate 00. The orthographic projection of the intermediate layer 003 on the base substrate 00 is covered by the orthographic projection of the second insulating layer 004 on the base substrate 00.

In some embodiments, the thin film transistor includes one or more vias extending through both the first insulating layer 002 and the second insulating layer 004. Optionally, the first target layer 001 is electrically connected to the second target layer 005 through the one or more vias.

Optionally, the one or more vias extending through the first insulating layer 002 and the second insulating layer 004 includes a first via V1 and a second via V2 respectively extending through both the first insulating layer 002 and the second insulating layer 004. Optionally, the intermediate layer 003 is between the first via V1 and the second via V2. Optionally, the first via V1 and the second via V2 are symmetrically arranged with respect to the intermediate layer 003. For example, the first target layer 001 is electrically connected to the second target layer 005 through the first via V1 and the second via V2.

Referring to FIG. 2, in some embodiments, the second target layer 005 includes a first portion 0051 and a second portion 0052. Optionally, the first portion 0051 and the second portion 0052 are connected to each other. Optionally, the second portion 0052 of the second target layer 005 is in the one or more vias. For example, the second portion 0052 of the second target layer 005 is in the first via V1 and the second via V2.

Figure 3:
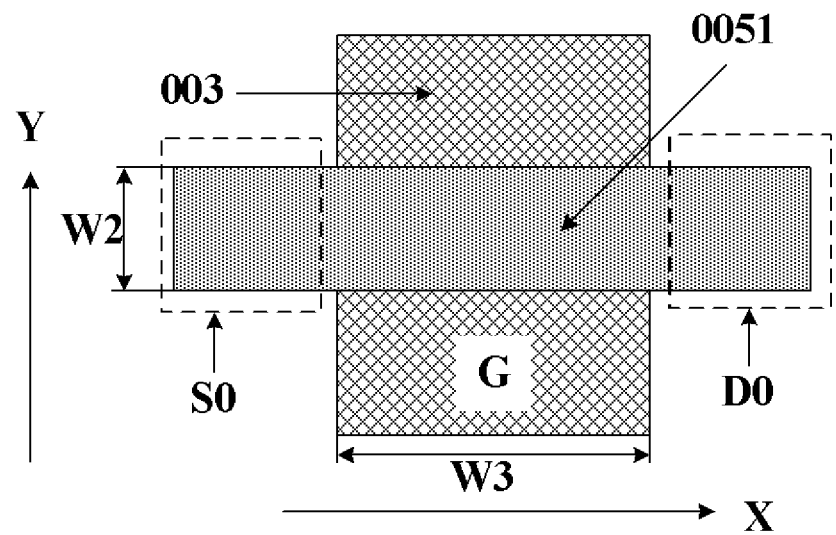
FIG. 3 is a plan view of a thin film transistor in some embodiments according to the present disclosure.
Figure 4:
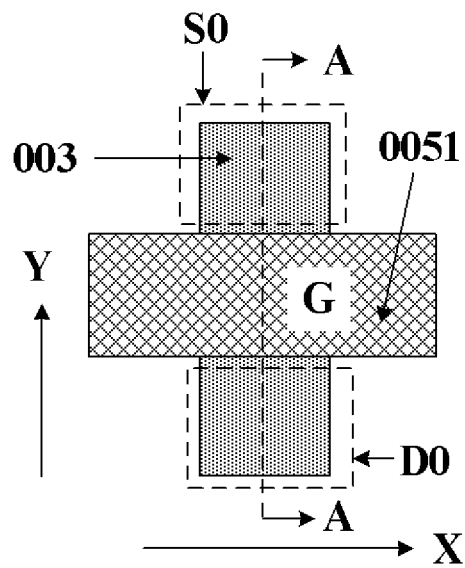
FIG. 4 is a plan view of a thin film transistor in some embodiments according to the present disclosure.

FIG. 3 is a plan view of a thin film transistor in some embodiments according to the present disclosure. FIG. 4 is a plan view of a thin film transistor in some embodiments according to the present disclosure. Both FIG. 3 and FIG. 4 do not show the first insulating layer 002 and a second insulating layer 004.

Referring to FIG. 1A to FIG. 4, optionally, the first portion 0051 of the second target layer 005 and the first target layer 001 extends along a first direction X. For example, the first portion 0051 of the second target layer 005 and the first target layer 001 have a bar shape extending along the first direction X.

In some embodiments, the intermediate layer 003 extends along the first direction X or a second direction Y that is perpendicular to the first direction X. For example, the intermediate layer 003 has a bar shape extending along the first direction X or a second direction Y that is perpendicular to the first direction X.

Referring to FIG. 3 and FIG. 4, optionally, the intermediate layer 003 has the bar shape extending along the second direction Y.

Figure 5:
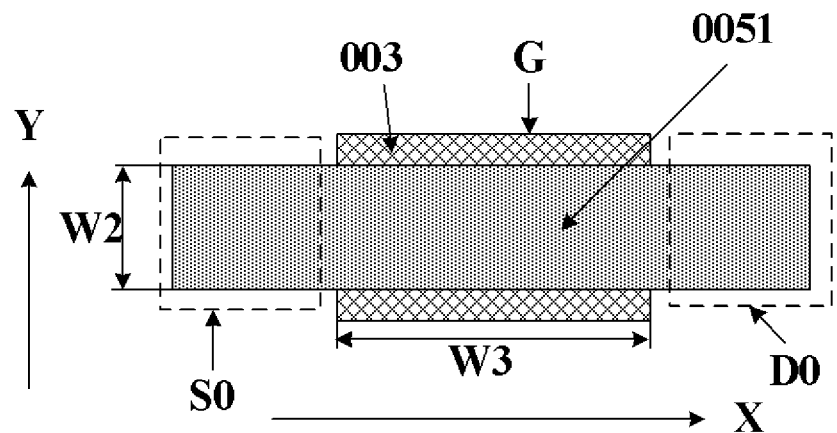
FIG. 5 is a plan view of a thin film transistor in some embodiments according to the present disclosure.
Figure 6:
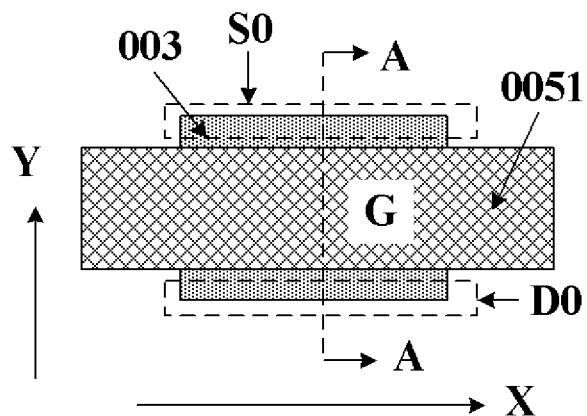
FIG. 6 is a plan view of a thin film transistor in some embodiments according to the present disclosure.

FIG. 5 is a plan view of a thin film transistor in some embodiments according to the present disclosure. FIG. 6 is a plan view of a thin film transistor in some embodiments according to the present disclosure. Referring to FIG. 5 and FIG. 6, optionally, the intermediate layer 003 has the bar shape extending along the first direction X.

In some embodiments, the intermediate layer 003 is parallel to the first target layer 001 or the second target layer 005. Optionally, the intermediate layer 003 is perpendicular to the first target layer 001 or the second target layer 005.

Referring to FIG. 1B, FIG. 3 and FIG. 4, in some embodiments, the intermediate layer 003 has a bar shape along the second direction Y. The first portion 0051 of the second target layer 005 and the first target layer 001 have the bar shape along a first direction X.

Optionally, the first target layer 001 has a first length L1 along the first direction X and a first width W1 along the second direction Y. Optionally, the first portion 0051 of the second target layer 005 has a second length L2 along the first direction X and a second width W2 along the second direction Y. Optionally, the intermediate layer 300 has a third width W3 along the first direction X, and a third length L3 along the second direction Y.

Optionally, the first width W1 of the first target layer 001 is substantially the same as the second width W2 of the first portion 0051 of the second target layer 005. Optionally, the first width W1 of the first target layer 001 is different from the second width W2 of the first portion 0051 of the second target layer 005.

As used herein, the term "substantially the same" refers to a difference between two values not exceeding 10% of a base value (e.g., one of the two values), e.g., not exceeding 8%, not exceeding 6%, not exceeding 4%, not exceeding 2%, not exceeding 1%, not exceeding 0.5%, not exceeding 0.1%, not exceeding 0.05%, and not exceeding 0.01%, of the base value. For example, the difference between the first width W1 of the first target layer 001 and the second width W2 of the first portion 0051 of the second target layer 005 does not exceed 10% of the first width W1 of the first target layer 001.

Optionally, the third length W3 of the intermediate layer 003 is greater than the first width W1 of the first target layer 001 and greater than the second width W2 of the first portion 0051 of the second target layer 005.

In some embodiments, the first target layer 001 and the second target layer 005 together constitute the active layer. The first width W1 of the first target layer 001 and the second width W2 of the first portion 0051 of the second target layer 005 are half of a width of an active layer of a conventional thin film transistor, which may reduce the size, in a plane parallel to the base substrate, of the thin film transistor disclosed in the present disclosure, and, at the same time, ensure that the thin film transistor disclosed in the present disclosure has the same ratio of the width of the channel region to the length of the channel region as the conventional thin film transistor.

For example, the first target layer 001 and the second target layer 005 together constitute the active layer, and the intermediate layer 003 is the gate electrode. Both the first width W1 of the first target layer 001 and the second width W2 of the first portion 0051 of the second target layer 005 are smaller than the third width W3 of the intermediate layer 003. By reducing the first width W1 of the first target layer 001 and the second width W2 of the first portion 0051 of the second target layer 005, the size, in a plane parallel to the base substrate, of the thin film transistor disclosed in the present disclosure is reduced, which may fabricate a display apparatus having narrow frame and high resolution, using the thin film transistor disclosed in the present disclosure.

In some embodiments, the thin film transistor includes a source electrode and a drain electrode. Optionally, the source electrode and the drain electrode are respectively connected to the active layer.

In one example, the intermediate layer is the gate electrode, the first target layer and the second target layer together constitute the active layer. The source electrode is electrically connected to one of the first target layer and the second target layer, and the drain electrode is electrically connected to one of the first target layer and the second target layer. For example, the source electrode and the drain electrode are both electrically connected to the first target layer. For example, the source electrode and the drain electrode are both electrically connected to the second target layer. For example, the source electrode is electrically connected to the first target layer, and the drain electrode is electrically connected to the second target layer. For example, the source electrode is electrically connected to the second target layer, and the drain electrode is electrically connected to the first target layer.

In another example, the intermediate layer is the active layer, and the first target layer and the second target layer together constitute the gate electrode. The source electrode and the drain electrode are both electrically connected to the intermediate layer.

Figure 7:
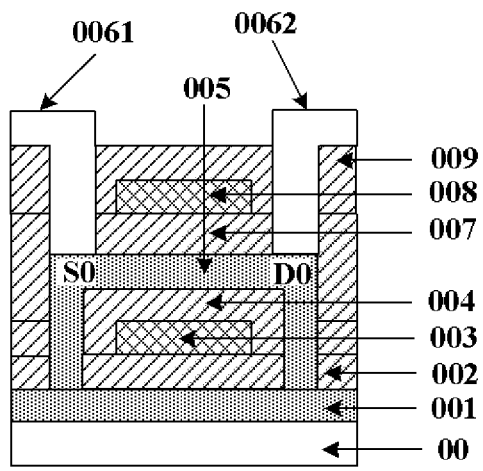
FIG. 7 is a schematic diagram of a source electrode and a drain electrode formed on a base substrate in some embodiments according to the present disclosure.

FIG. 7 is a schematic diagram of a source electrode and a drain electrode formed on a base substrate in some embodiments according to the present disclosure. Referring to FIG. 7, in some embodiments, the intermediate layer 003 is the gate electrode, the first target layer 001 and the second target layer 005 together constitute the active layer. Optionally, the source electrode 0061 is electrically connected to one of the first target layer 001 and the second target layer 005, and the drain electrode 0062 is electrically connected to one of the first target layer 001 and the second target layer 005.

In one example, the source electrode 0061 and the drain electrode 0062 are formed on a side of the second target layer 005 away from the base substrate 00. The source electrode 0061 and the drain electrode 0062 are both electrically connected to the second target layer 005.

In another example, the source electrode and the drain electrode are formed on a side of the first target layer closer to the base substrate. The source electrode and drain electrode are both electrically connected to the first target layer.

Referring to FIG. 3, FIG. 5, and FIG. 7, optionally, the source electrode 0061 is electrically connected to a source electrode contacting region S0 of the first portion 0051 of the second target layer 005. Optionally, the drain electrode 0062 is electrically connected to a drain electrode contacting region D0 of the first portion 0051 of the second target layer 005.

Figure 8:
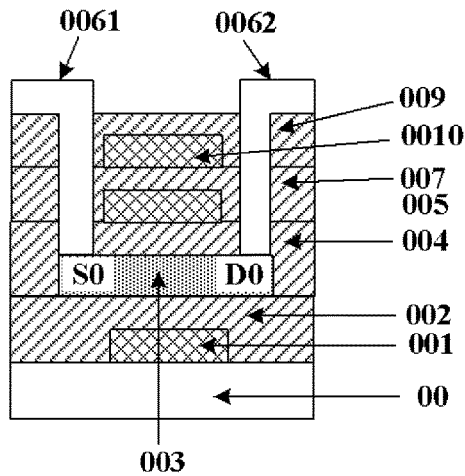
FIG. 8 is a schematic diagram of a source electrode and a drain electrode formed on a base substrate in some embodiments according to the present disclosure.

FIG. 8 is a schematic diagram of a source electrode and a drain electrode formed on a base substrate in some embodiments according to the present disclosure. Referring to FIG. 8, in some embodiments, the intermediate layer 003 is the active layer, and the first target layer 001 and the second target layer 005 together constitute the gate electrode. The source electrode 0061 and the drain electrode 0062 are both electrically connected to the intermediate layer 003.

In one example, the source electrode 0061 and the second electrode 0062 are formed on a side of the intermediate layer 003 away from the base substrate 00. The source electrode 0061 and the second electrode 0062 are electrically connected to the intermediate layer 003. In another example, the source electrode 0061 and the second electrode 0062 are formed on a side of the intermediate layer 003 closer to the base substrate 00. The source electrode 0061 and the second electrode 0062 are electrically connected to the intermediate layer 003.

Referring to FIG. 4, FIG. 6, and FIG. 8, optionally, the source electrode 0061 is electrically connected to a source electrode contacting region S0 of the intermediate layer 003. Optionally, the drain electrode 0062 is electrically connected to a drain electrode contacting region D0 of the intermediate layer 003.

In some embodiments, the first insulating layer and the second insulating layer include a same materials. Various appropriate materials may be used for making the first insulating layer and the second insulating layer. Examples of materials suitable for making the first insulating layer and the second insulating layer include, but are not limited to, silicon oxide and silicon nitride.

Various appropriate materials may be used for making the active layer. Examples of materials suitable for making the active layer include, but are not limited to, poly crystalline silicon materials, metal oxide materials, and amorphous silicon materials. Optionally, the poly crystalline silicon materials include, but are not limited to, low temperate poly crystalline silicon. Optionally, the metal oxide materials include, but are not limited to, indium gallium zinc oxide (IGZO) or zinc oxide (ZnO).

Various appropriate materials may be used for making the gate electrode. Examples of materials suitable for making the gate electrode include, but are not limited to, metals or alloys. Optionally, metals suitable for making the gate electrode include, but are not limited to, Molybdenum (Mo), aluminum (Al), chromium (Cr), copper (Cu), and titanium (Ti). Optionally, alloys suitable for making the gate electrode include, but are not limited to, aluminum-nickel alloy. Optionally, the gate electrode is formed by a single-layer metal film or signal-layer alloy film. Optionally, the gate electrode is formed by a multi-layer metal film. In one example, the multi-layer metal film is made of a Molybdenum (Mo) film, an aluminum (Al) film, and a Molybdenum (Mo) film sequentially stacked together. In another example, the multi-layer metal film is made of a titanium (Ti) film, an aluminum (Al) film, and a titanium (Ti) film sequentially stacked together.

In some embodiments, the gate electrode, the source electrode, and the drain electrode includes a same material.

In some embodiments, the thin film transistor disclosed herein has a first target layer, a first insulating layer, an intermediate layer, a second insulating layer, and a second target layer sequentially stacked on a base substrate. In some embodiments, the first target layer and the second target layer together constitute one of an active layer and a gate electrode.

In one example, the first target layer and the second target layer together constitute the active layer, to form a first channel region of the first target layer and the second channel region of the second target layer encircling the intermediate layer (e.g. the gate electrode). A width of the channel region of the thin film transistor is a value of a sum of a first channel width of the first channel region and a second channel width of the second channel region, e.g. the width of the channel region of the thin film transistor is a value of a sum of the first width of the first target layer and the second width of a second target layer. The ratio of the width of the channel region to the length of the channel region can maintain in a relative greater value, even though the first width of the first target layer or the second width of the second target layer is reduced. By reducing the first width of the first target layer or the second width of the second target layer, the size of thin film transistor in a plane parallel to the base substrate is reduced without weakening the driving capacity of the thin film transistor.

In another example, the first target layer and the second target layer together constitute the gate electrode, to encircle the intermediate layer (e.g. the active layer), resulting the active layer between two gate sub-electrodes of the gate electrode. The two gate sub-electrodes (e.g. the first target layer and the second target layer) together drive the active layer, which may enhance the driving capacity of the thin film transistor.

In some embodiments, the thin film transistor described herein can enhance the driving capacity without increasing the size of thin film transistor in a plane parallel to the base substrate, and the thin film transistor described herein can be used to fabricate a display apparatus having a narrow frame and high resolution.

Figure 9:
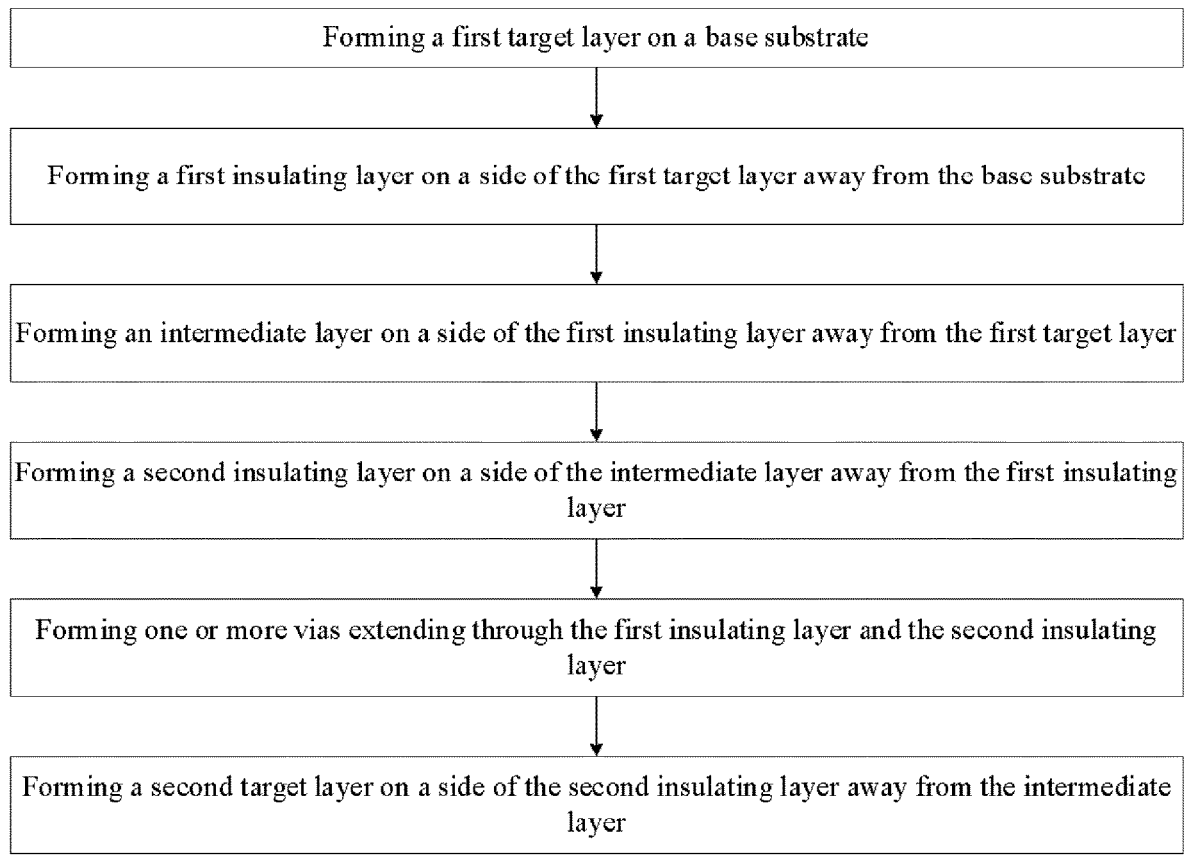
FIG. 9 is a flow chart illustrating a method of fabricating a thin film transistor in some embodiments according to the present disclosure.

In another aspect, the present disclosure also provides a method of fabricating a thin film transistor. FIG. 9 is a flow chart illustrating a method of fabricating a thin film transistor in some embodiments according to the present disclosure. Referring to FIG. 9, in some embodiments, a method of fabricating a thin film transistor includes forming a first target layer on a base substrate. Optionally, the base substrate is a glass substrate. Optionally, the first target layer is a first active sub-layer. Optionally, the first target layer is a first gate sub-electrode.

In some embodiments, the method of fabricating the thin film transistor includes forming a first insulating layer on a side of the first target layer away from the base substrate.

Various appropriate materials may be used for making the first insulating layer. Examples of materials suitable for making the first insulating layer include, but are not limited to, silicon oxide and silicon nitride.

In some embodiments, the method of fabricating the thin film transistor includes forming an intermediate layer on a side of the first insulating layer away from the first target layer.

In one example, the first target layer is the first active sub-layer, the intermediate layer is a gate electrode. In another example, the first target layer is the first gate sub-electrode, the intermediate layer is the active layer.

In some embodiments, the method of fabricating the thin film transistor includes forming a second insulating layer on a side of the intermediate layer away from the first insulating layer.

Various appropriate materials may be used for making the second insulating layer. Examples of materials suitable for making the second insulating layer include, but are not limited to, silicon oxide and silicon nitride.

In some embodiments, the method of fabricating the thin film transistor includes forming a second target layer on a side of the second insulating layer away from the intermediate layer.

Optionally, the second target layer plays a same role as the first target layer. In one example, the first target layer is the first active sub-layer, and the second target layer is a second active sub-layer. So, the first target layer and the second target layer together constitute the active layer. In another example, the first target layer is the first gate sub-electrode, and the second target layer is a second gate sub-electrode. So, the first target layer and the second target layer together constitute the gate electrode.

Optionally, the first target layer is electrically connected to the second target layer. Optionally, an orthographic projection of the intermediate layer on the base substrate at least partially overlaps with an orthographic projection of the first target layer on the base substrate; the orthographic projection of the intermediate layer on the base substrate at least partially overlaps with an orthographic projection of the second target layer on the base substrate.

Optionally, the intermediate layer is one of a gate electrode and an active layer, and the first target layer and the second target layer constitute another one of the gate electrode and the active layer.

In some embodiment, the intermediate layer is the gate electrode, the first target layer and the second target layer together constitute the active layer. Two channel regions is formed in the thin film transistor, and the intermediate layer is between the two channel regions.

Optionally, the first target layer has a first width along a second direction. Optionally, the second target layer has a second width along the second direction. Optionally, the intermediate layer has a third width along the first direction. Optionally, the second direction is perpendicular to the first direction.

Optionally, the orthographic projection of the intermediate layer (e.g. the gate electrode) on the base substrate at least partially overlaps with the orthographic projection of the first target layer (e.g. the active layer) on the base substrate. A region of the first target layer (e.g. the active layer) having an orthographic projection on the base substrate covered by the orthographic projection of the intermediate layer (e.g. the gate electrode) on the base substrate is a first channel region of the first target layer.

Optionally, the orthographic projection of the intermediate layer on the base substrate at least partially overlaps with the orthographic projection of the second target layer (e.g. the active layer) on the base substrate. A region of the second target layer (e.g. the active layer) having an orthographic projection on the base substrate covered by the orthographic projection of the intermediate layer (e.g. the gate electrode) on the base substrate is a second channel region of the second target layer.

Optionally, a width of the channel region of the thin film transistor is a value of a sum of a first channel width of the first channel region and a second channel width of the second channel region. Optionally, since the channel region of the active layer has a width substantially the same as the width of the active layer, the first channel width of the first channel region is substantially the same as the first width of the first target layer. The second channel width of the second channel region is substantially the same as the second width of the second target layer. For example, the width of the channel region of the thin film transistor is a value of a sum of the first width of the first target layer and the second width of a second target layer.

Optionally, the channel region of the active layer has a length substantially the same as the width of the gate electrode. Optionally, the length of the channel region of the thin film transistor is the third width of the intermediate layer.

Optionally, the ratio of the width of the channel region to the length of the channel region can maintain in a relative greater value, even though the first width of the first target layer or the second width of the second target layer is reduced. For example, the ratio of the width of the channel region to the length of the channel region can maintain, when the first width of the first target layer and the second width of the second target layer are reduced to half of a width of a channel region of a conventional thin film transistor.

By reducing the first width of the first target layer or the second width of the second target layer, the size of thin film transistor in a plane parallel to the base substrate is reduced without weakening the driving capacity of the thin film transistor.

In some embodiments, the intermediate layer is the active layer. The first target layer and the second target layer together constitute the gate electrode, for example, the first target layer is the first gate sub-electrode, and the second target layer is the second gate sub-electrode. Optionally, the gate electrode (e.g. the first target layer and the second target layer) encircles the active layer (e.g. the intermediate layer), resulting the active layer between two gate sub-electrodes of the gate electrode. For example, the two gate sub-electrodes together drive the active layer, which may enhance the driving capacity of the thin film transistor.

In some embodiments, the method of fabricating the thin film transistor disclosed herein fabricating a thin film transistor having a first target layer, a first insulating layer, an intermediate layer, a second insulating layer, and a second target layer sequentially stacked on a base substrate. In some embodiments, the first target layer and the second target layer together constitute one of an active layer and a gate electrode.

In one example, the first target layer and the second target layer together constitute the active layer, to form a first channel region of the first target layer and the second channel region of the second target layer encircling the intermediate layer (e.g. the gate electrode). A width of the channel region of the thin film transistor is a value of a sum of a first channel width of the first channel region and a second channel width of the second channel region, e.g. the width of the channel region of the thin film transistor is a value of a sum of the first width of the first target layer and the second width of a second target layer. The ratio of the width of the channel region to the length of the channel region can maintain in a relative greater value, even though the first width of the first target layer or the second width of the second target layer is reduced. By reducing the first width of the first target layer or the second width of the second target layer, the size of thin film transistor in a plane parallel to the base substrate is reduced without weakening the driving capacity of the thin film transistor.

In another example, the first target layer and the second target layer together constitute the gate electrode, to encircle the intermediate layer (e.g. the active layer), resulting the active layer between two gate sub-electrodes of the gate electrode. The two gate sub-electrodes (e.g. the first target layer and the second target layer) together drive the active layer, which may enhance the driving capacity of the thin film transistor.

In some embodiments, the thin film transistor described herein can enhance the driving capacity without increasing the size of thin film transistor in a plane parallel to the base substrate, and the thin film transistor described herein can be used to fabricate a display apparatus having a narrow frame and high resolution.

In some embodiments, prior to forming the second target layer, the method of fabricating a thin film transistor includes forming one or more vias extending through the first insulating layer and the second insulating layer. Optionally, the one or more vias is formed to partially expose a surface of the first target layer away from the base substrate.

Optionally, the second target layer is formed on the side of the second insulating layer away from the first insulating layer; and the second target layer is formed to extend through the first insulating layer and the second insulating layer through the one or more vias to electrically connect to the first target layer.

Optionally, forming the one or more vias includes forming a first via and a second via respectively extending through both the first insulating layer and the second insulating layer. Optionally, the intermediate layer is between the first via and the second via. Optionally, the first via and the second via are symmetrically arranged with respect to the intermediate layer.

In some embodiments, the present disclosure provides a method of fabricating a thin film transistor whose intermediate layer is a gate electrode. For example, the intermediate layer of the thin film transistor is formed to be the gate electrode. The first target layer and the second target layer are formed to constitute an active layer.

Figure 10:
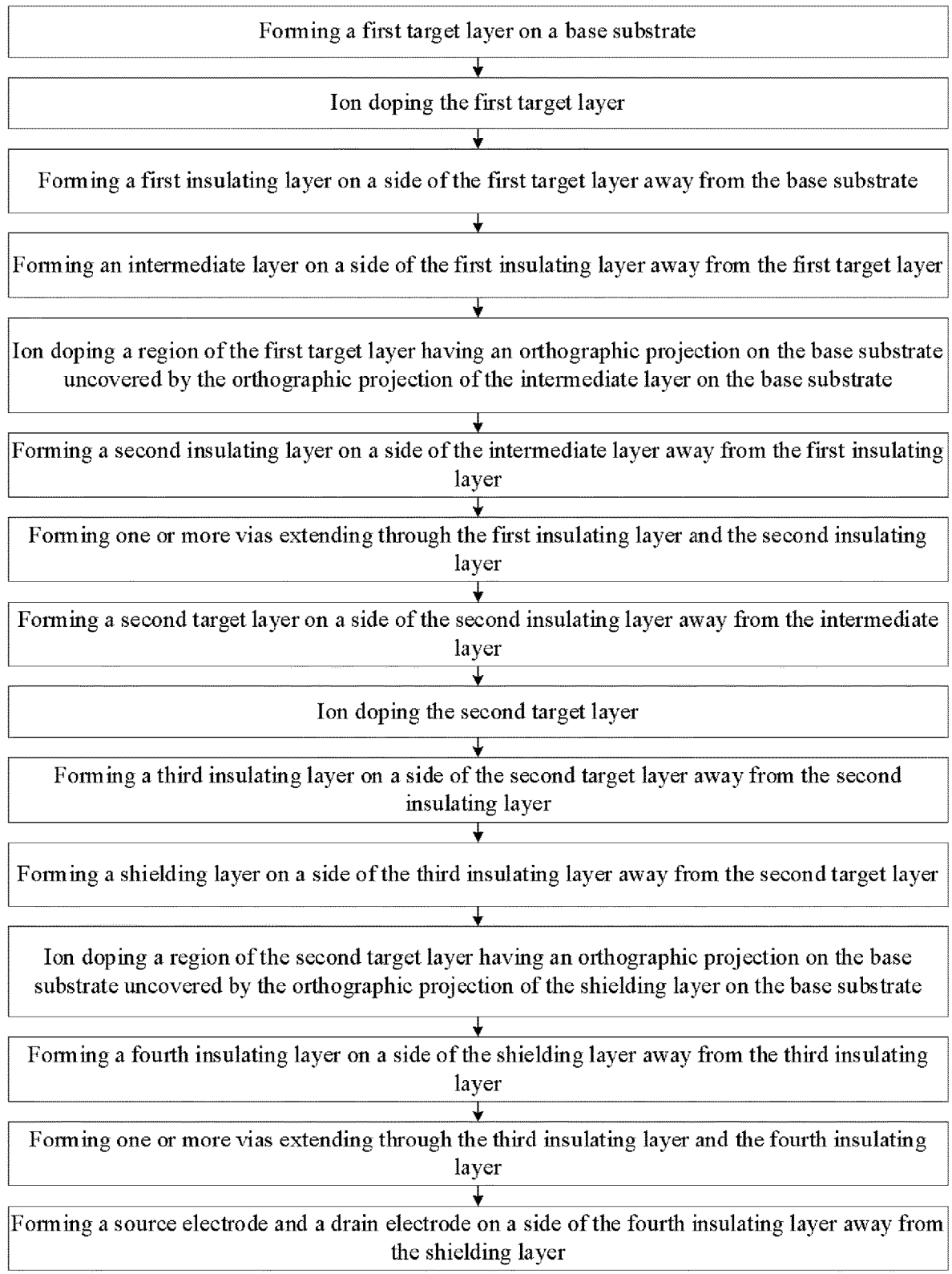
FIG. 10 is a flow chart illustrating a method of fabricating a thin film transistor in some embodiments according to the present disclosure.

FIG. 10 is a flow chart illustrating a method of fabricating a thin film transistor in some embodiments according to the present disclosure. Referring to FIG. 10, in some embodiments, the method of fabricating the thin film transistor includes forming a first target layer on a base substrate; performing ion doping to the first target layer; forming a first insulating layer on a side of the first target layer away from the base substrate; forming an intermediate layer on a side of the first insulating layer away from the first target layer; performing ion doping to a region of the first target layer having an orthographic projection on the base substrate uncovered by the orthographic projection of the intermediate layer on the base substrate; forming a second insulating layer on a side of the intermediate layer away from the first insulating layer; forming one or more vias extending through the first insulating layer and the second insulating layer; forming a second target layer on a side of the second insulating layer away from the intermediate layer; performing ion doping to the second target layer; forming a third insulating layer on a side of the second target layer away from the second insulating layer; forming a shielding layer on a side of the third insulating layer away from the second target layer; performing ion doping to a region of the second target layer having an orthographic projection on the base substrate uncovered by the orthographic projection of the shielding layer on the base substrate; forming a fourth insulating layer on a side of the shielding layer away from the third insulating layer; forming one or more vias extending through the third insulating layer and the fourth insulating layer; and forming a source electrode and a drain electrode on a side of the fourth insulating layer away from the shielding layer.

Figure 11:
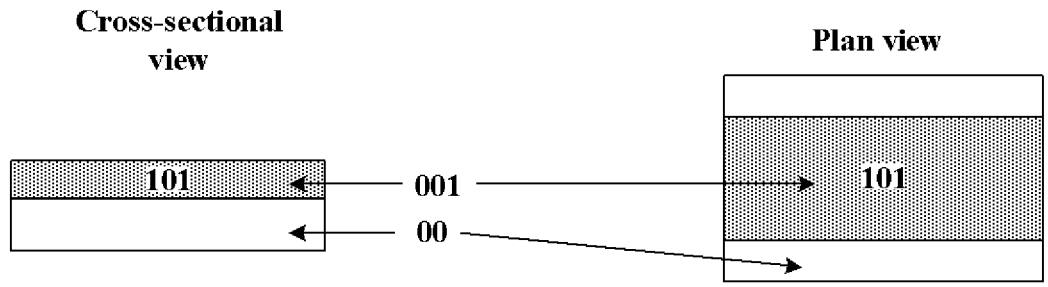
FIG. 11 is a schematic diagram having a cross-sectional view and a plan view of a first target layer formed on a base substrate in some embodiments according to the present disclosure.

FIG. 11 is a schematic diagram having a cross-sectional view and a plan view of a first target layer formed on a base substrate in some embodiments according to the present disclosure. Referring to FIG. 11, in some embodiments, the method of fabricating the thin film transistor includes forming a first target layer 001 on a base substrate 00. Optionally, the first target layer 001 is a first active sub-layer.

Various appropriate materials may be used for making the first target layer (e.g. the first active sub-layer). Examples of materials suitable for making the first target layer include, but are not limited to, poly crystalline silicon materials, metal oxide materials, and amorphous silicon materials.

Optionally, forming the first target layer 001 (e.g. the first active sub-layer) includes depositing a first target material layer 101 on the base substrate 00; and patterning the first target material layer 101 using a lithography process to form the first target layer 001. For example, forming the first active sub-layer includes depositing an oxide semiconductor layer on the substrate; and patterning the oxide semiconductor layer using a lithography process to obtain the first active sub-layer.

Various methods may be used for forming the first target material layer 101. Examples of methods suitable for forming the first target material layer 101 include, but are not limited to, sputtering, thermal evaporation, plasma enhanced chemical vapor deposition (PECVD), low pressure chemical vapor deposition (LPCVD), atmospheric pressure chemical vapor deposition (APCVD), electron cyclotron resonance chemical vapor deposition (ECR-CVD).

Various method may be included in the lithography process for patterning the first target material layer 101. Examples of methods in the lithography process for patterning the first target material layer 101 include, but are not limited to, photoresist coating, exposing, developing, etching, and stripping the photoresist.

Figure 12:
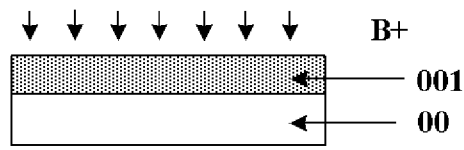
FIG. 12 is a schematic diagram illustrating an ion doping process performed on a first target layer in some embodiments according to the present disclosure.

FIG. 12 is a schematic diagram illustrating an ion doping process performed on a first target layer in some embodiments according to the present disclosure. Referring to FIG. 12, in some embodiments, the method of fabricating the thin film transistor includes performing ion doping to the first target layer 001. By ion doping the first target layer 001, a threshold voltage of a channel region of an active layer to be formed by patterning the first target layer 001 can be adjusted. Optionally, a relatively small number of ion is doped in the first target layer 001. For example, boron ions are doped in the first target layer 001. The number of boron ions doped in the first target layer 001 is $10^{12}$.

Figure 13:
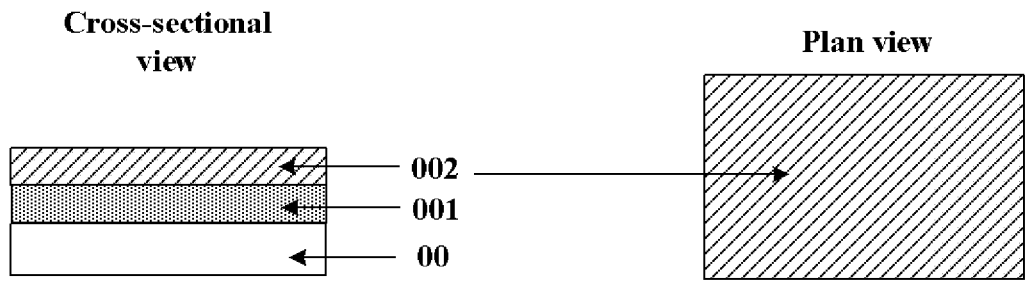
FIG. 13 is a schematic diagram having a cross-sectional view and a plan view of a first insulating layer formed on a side of the first target layer away from a base substrate in some embodiments according to the present disclosure.

FIG. 13 is a schematic diagram having a cross-sectional view and a plan view of a first insulating layer formed on a side of the first target layer away from a base substrate in some embodiments according to the present disclosure. Referring to FIG. 13, in some embodiments, the method of fabricating the thin film transistor includes forming a first insulating layer 002 on a side of the first target layer 001 away from the base substrate 00.

Various appropriate materials may be used for making the first insulating layer 002. Examples of materials suitable for making the first insulating layer 002 include, but are not limited to, insulating materials such as silicon oxide and silicon nitride.

Optionally, the first insulating layer 002 is formed using plasma enhanced chemical vapor deposition (PECVD).

Figure 14:
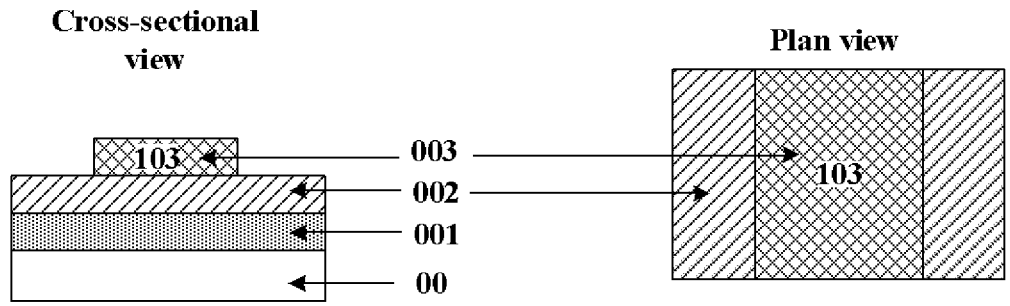
FIG. 14 is a schematic diagram having a cross-sectional view and a plan view of an intermediate layer formed on a side of the first insulating layer away from a base substrate in some embodiments according to the present disclosure.

FIG. 14 is a schematic diagram having a cross-sectional view and a plan view of an intermediate layer formed on a side of the first insulating layer away from a base substrate in some embodiments according to the present disclosure. Referring to FIG. 14, in some embodiments, the method of fabricating the thin film transistor includes forming an intermediate layer 003 on a side of the first insulating layer 002 away from the first target layer 001.

Optionally, the intermediate layer 003 is the gate electrode. Optionally, forming the intermediate layer 003 includes forming an intermediate material layer 103 on a side of the first insulating layer 002 away from the first target layer 001; and patterning the intermediate material layer 103 to form the intermediate layer 003. For example, forming the gate electrode (e.g. the intermediate layer) includes forming a metal layer having one or more metals with low resistance on the side of the first insulating layer 002 away from the first target layer 001; and patterning the metal layer to form the gate electrode.

Optionally, the intermediate material layer 103 is a metal layer having one or more metals with low resistance. Various appropriate materials may be used for making the intermediate material layer 103. Examples of materials suitable for making the intermediate material layer 103 include, but are not limited to, metals or alloys. Optionally, metals suitable for making the intermediate material layer 103 include, but are not limited to, Molybdenum (Mo), aluminum (Al), chromium (Cr), copper (Cu), and titanium (Ti). Optionally, alloys suitable for making the intermediate material layer 103 include, but are not limited to, aluminum-nickel alloy. Optionally, the intermediate material layer 103 is formed by a single-layer metal film or signal-layer alloy film. Optionally, the intermediate material layer 103 is formed by a multi-layer metal layer. In one example, the multi-layer metal layer is made of a Molybdenum (Mo) film, an aluminum (Al) film, and a Molybdenum (Mo) film sequentially stacked together. In another example, the multi-layer metal layer is made of a titanium (Ti) film, an aluminum (Al) film, and a titanium (Ti) film sequentially stacked together.

Various appropriate methods may be used for forming the intermediate material layer 103. Examples of methods suitable for forming the intermediate material layer include, but are not limited to, physical vapor deposition method such as magnetron sputtering.

Figure 15:
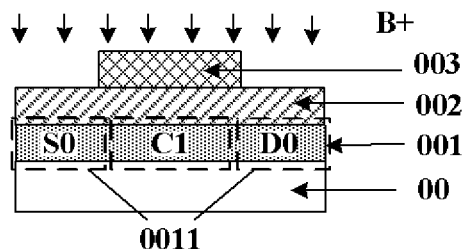
FIG. 15 is a schematic diagram illustrating an ion doping process performed on a region of a first target layer having an orthographic projection on a base substrate uncovered by an orthographic projection of an intermediate layer on the base substrate in some embodiments according to the present disclosure.

FIG. 15 is a schematic diagram illustrating an ion doping process performed on a region of a first target layer having an orthographic projection on a base substrate uncovered by an orthographic projection of an intermediate layer on the base substrate in some embodiments according to the present disclosure. Referring to FIG. 15, in some embodiments, the method of fabricating the thin film transistor includes performing ion doping to a region 0011 of the first target layer 001 having an orthographic projection on the base substrate 00 uncovered by the orthographic projection of the intermediate layer 003 on the base substrate 00. For example, region 0011 of the first target layer 001 is uncovered by the intermediate layer 003.

Optionally, the intermediate layer 003 can prevent the first channel region C1 of the first target layer 001 from being ion doped, and the region 0011 other than the first channel region C1 is doped with ion. Optionally, the region 0011 corresponds to the source electrode contacting region S0 and the drain electrode contracting region D0. By ion doping in the region 0011 (e.g. the source electrode contacting region S0 and the drain electrode contracting region D0) of the first target layer 001, the conductivity of the region 0011 is enhanced.

Optionally, a relatively large number of ions can be doped in the region 0011 of the first target layer 001. For example, boron ions are doped in the region 0011 (e.g. the source electrode contacting region S0 and the drain electrode contracting region D0) of the first target layer 001. The number of boron ions doped in the region 0011 (e.g. the source electrode contacting region S0 and the drain electrode contracting region D0) of the first target layer 001 is $10^{14}$.

Figure 16:
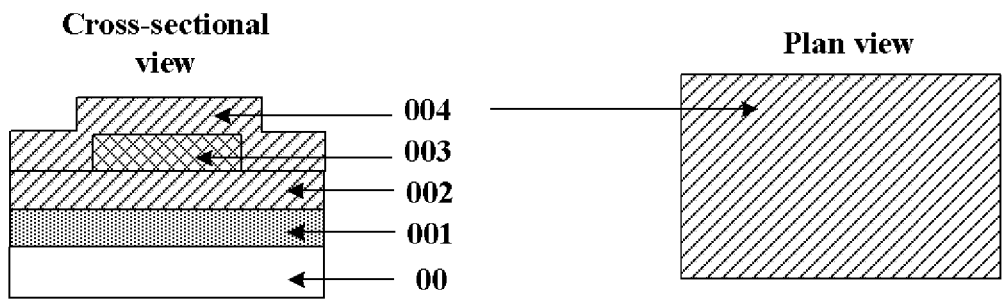
FIG. 16 is a schematic diagram having a cross-sectional view and a plan view of a second insulating layer formed on a side of an intermediate layer away from a base substrate in some embodiments according to the present disclosure.

FIG. 16 is a schematic diagram having a cross-sectional view and a plan view of a second insulating layer formed on a side of an intermediate layer away from a base substrate in some embodiments according to the present disclosure. Referring to FIG. 16, in some embodiments, the method of fabricating the thin film transistor includes forming a second insulating layer 004 on a side of the intermediate layer 003 away from the first insulating layer 002.

Optionally, the second insulating layer 004 and the first insulating layer 002 includes a same materials. For example, the second insulating layer 004 and the first insulating layer 002 are made of silicon nitride. Optionally, the second insulating layer 004 is made of a material different from the one of first insulating layer 002. For example, the second insulating layer 004 is made of silicon nitride, and the first insulating layer 002 is made of silicon oxide.

Various appropriate materials may be used for making the second insulating layer 004. Examples of materials suitable for making the second insulating layer 004 include, but are not limited to, insulating materials such as silicon oxide and silicon nitride.

Optionally, the second insulating layer 004 is formed using plasma enhanced chemical vapor deposition (PECVD).

Figure 17:
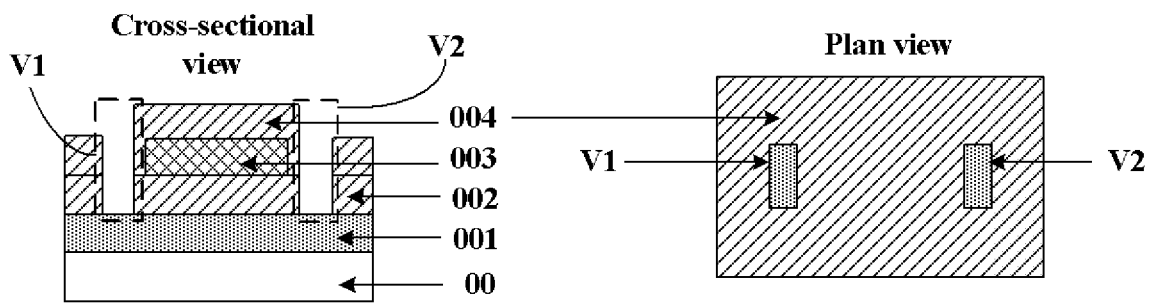
FIG. 17 is a schematic diagram having a cross-sectional view and a plan view of one or more vias extending through a first insulating layer and a second insulating layer in some embodiments according to the present disclosure.

FIG. 17 is a schematic diagram having a cross-sectional view and a plan view of one or more vias extending through a first insulating layer and a second insulating layer in some embodiments according to the present disclosure. Referring to FIG. 17, in some embodiments, the method of fabricating the thin film transistor includes forming one or more vias extending through the first insulating layer 002 and the second insulating layer 004. Optionally, the one or more vias extends through the first insulating layer 002 and the second insulating layer 004 to partially expose a surface of the first target layer 001 away from the base substrate 00.

Optionally, forming one or more vias includes forming a first via V1 and a second via V2 respectively extending through both the first insulating layer 002 and the second insulating layer 004. Optionally, the intermediate layer 003 is between the first via V1 and the second via V2. Optionally, the first via V1 and the second via V2 are symmetrically arranged with respect to the intermediate layer 003.

Figure 18:
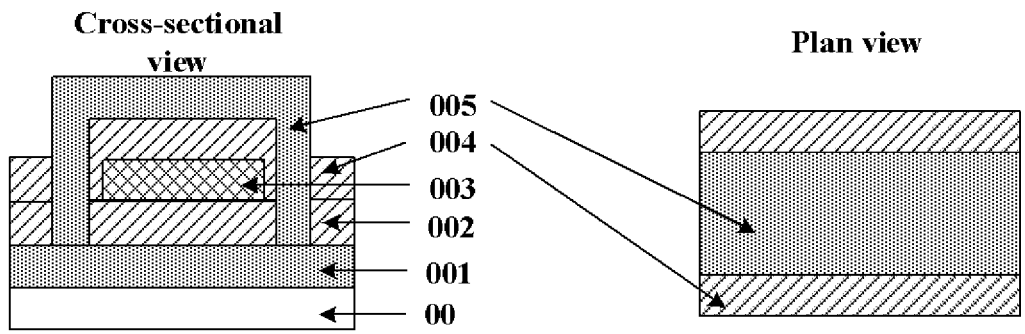
FIG. 18 is a schematic diagram having a cross-sectional view and a plan view of a second target layer formed on a side of a second insulating layer away from a base substrate in some embodiments according to the present disclosure.

FIG. 18 is a schematic diagram having a cross-sectional view and a plan view of a second target layer formed on a side of a second insulating layer away from a base substrate in some embodiments according to the present disclosure. In some embodiments, the method of fabricating the thin film transistor includes forming a second target layer 005 on a side of the second insulating layer 004 away from the intermediate layer 003.

Optionally, the second target layer 005 plays a same role as the first target layer 001. Optionally, the first target layer 001 is the first active sub-layer, the second target layer 005 is a second active sub-layer. For example, the first target layer 001 (e.g. the first active sub-layer) and the second target layer 005 (e.g. the second active sub-layer) together constitute the active layer.

Optionally, the first target layer 001 is electrically connected to the second target layer 005. For example, the first target layer 001 is electrically connected to the second target layer 005 through the one or more vias extending through the first insulating layer 002 and the second insulating layer 004.

Optionally, an orthographic projection of the intermediate layer 003 on the base substrate 00 at least partially overlaps with an orthographic projection of the first target layer 001 on the base substrate 00. Optionally, the orthographic projection of the intermediate layer 003 on the base substrate 00 at least partially overlaps with an orthographic projection of the second target layer 005 on the base substrate 00.

Optionally, the orthographic projection of the intermediate layer 003 on the base substrate 00 is covered by the orthographic projection of the first insulating layer 002 on the base substrate 00. Optionally, the orthographic projection of the intermediate layer 003 on the base substrate 00 is covered by the orthographic projection of the second insulating layer 004 on the base substrate 00.

Figure 19:
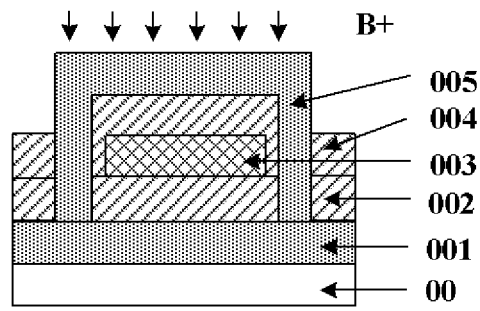
FIG. 19 is a schematic diagram illustrating an ion doping process performed on a second target layer in some embodiments according to the present disclosure.

FIG. 19 is a schematic diagram illustrating an ion doping process performed on a second target layer in some embodiments according to the present disclosure. Referring to FIG. 19, in some embodiments, the method of fabricating the thin film transistor includes performing ion doping to the second target layer 005.

By ion doping the second target layer 005, a threshold voltage of a channel region of an active layer to be formed by patterning the second target layer 001 can be adjusted. Optionally, a relatively small number of ion is doped in the second target layer 005. For example, boron ions are doped in the second target layer 005. The number of boron ions doped in the second target layer 005 is $10^{12}$.

Figure 20:
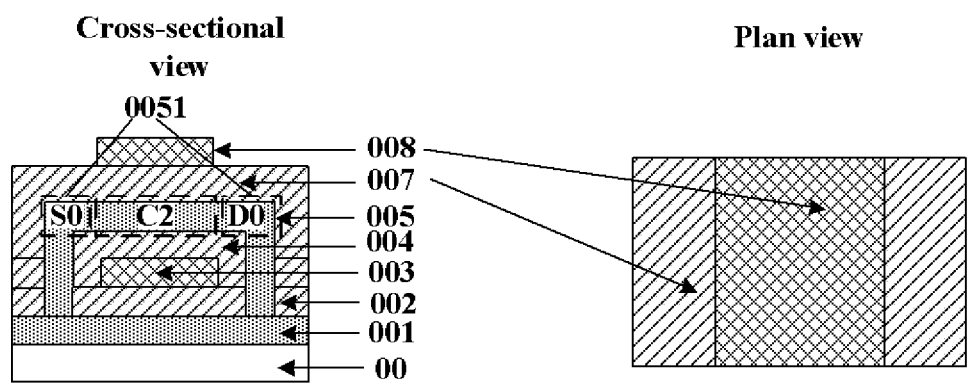
FIG. 20 is a schematic diagram having a cross-sectional view and a plan view of a third insulating layer and a shielding layer on a base substrate in some embodiments according to the present disclosure.

FIG. 20 is a schematic diagram having a cross-sectional view and a plan view of a third insulating layer and a shielding layer on a base substrate in some embodiments according to the present disclosure. Referring to FIG. 20, in some embodiments, the method of fabricating the thin film transistor includes forming a third insulating layer 007 on a side of the second target layer 005 away from the second insulating layer 004; and forming a shielding layer 008 on a side of the third insulating layer 007 away from the second target layer 005.

Optionally, an orthographic projection of the shielding layer 008 on the base substrate 00 substantially overlaps with the orthographic projection of the intermediate layer 003 on the base substrate 00. Optionally, the orthographic projection of the shielding layer 008 on the base substrate 00 substantially overlaps with the orthographic projection of a second channel region C2 of the second target layer 005 on the base substrate 00. For example, the shielding layer 008 covers the second channel region C2 of the second target layer 005.

By covering the second channel region C2 of the second target layer 005 using the shielding layer 008, it is more convenient to dope ion on an region 0051 (e.g. the source electrode contacting region S0 and the drain electrode contacting region D0) of the second target layer 005 other than the second channel region C2 of the second target layer 005, to reduce the resistance of the source electrode contacting region S0 and the resistance of the drain electrode contracting region D0 of the second target layer 005, and to enhance the conductivity of the source electrode contacting region S0 and the resistance of the drain electrode contracting region D0 of the second target layer 005.

Optionally, a second gate electrode is formed on a side of the third insulating layer away from the base substrate. Optionally, a mask used for patterning the shielding layer can also be used for patterning the second gate electrode. For example, the shielding layer and the second gate layer are formed in a same patterning step. Optionally, a pattern of the shielding layer is different from a pattern of the second gate electrode. The shielding layer 008 is formed prior to forming the second gate electrode. Subsequently, the second gate electrode is formed on a side of the shielding layer 008 away from the base substrate 00.

Optionally, the shielding layer 008 is electrically connected to the intermediate layer 003 through one or more vias extending through the second insulating layer 004 and the third insulating layer 007.

Optionally, the shielding layer 008 is floating. The floating shielding layer 008 can prevent the thin film transistor from being interrupted by other signals. As used herein, the term "floating" refers to an element on a base substrate is not electrically connected to any conductive element on the base substrate. For example, the shielding layer 008 is not electrically connected to any conductive element on the base substrate 00.

Figure 21:
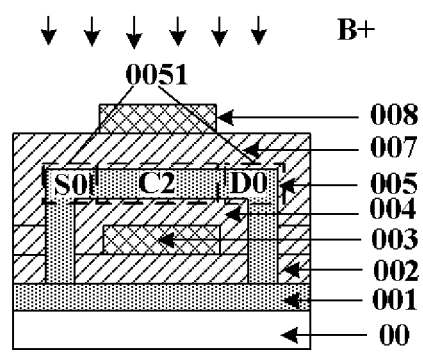
FIG. 21 is a schematic diagram illustrating an ion doping process performed on a region of a second target layer having an orthographic projection on a base substrate uncovered by an orthographic projection of a shielding layer on the base substrate in some embodiments according to the present disclosure.

FIG. 21 is a schematic diagram illustrating an ion doping process performed on a region of a second target layer having an orthographic projection on a base substrate uncovered by an orthographic projection of a shielding layer on the base substrate in some embodiments according to the present disclosure. Referring to FIG. 21, in some embodiments, the method of fabricating the thin film transistor includes performing ion doping to the region 0051 (e.g. the source electrode contacting region S0 and the drain electrode contacting region D0) of the second target layer 005 having an orthographic projection on the base substrate 00 uncovered by the orthographic projection of the shielding layer 008 on the base substrate 00, to enhance the conductivity of the source electrode contacting region S0 and the resistance of the drain electrode contracting region D0 of the second target layer 005.

Optionally, a relatively large number of ions can be doped in the region 0051 of the second target layer 005. For example, boron ions are doped in the region 0051 (e.g. the source electrode contacting region S0 and the drain electrode contracting region D0) of the second target layer 005. The number of boron ions doped in the region 0051 (e.g. the source electrode contacting region S0 and the drain electrode contracting region D0) of the second target layer 005 is $10^{14}$.

Figure 22:
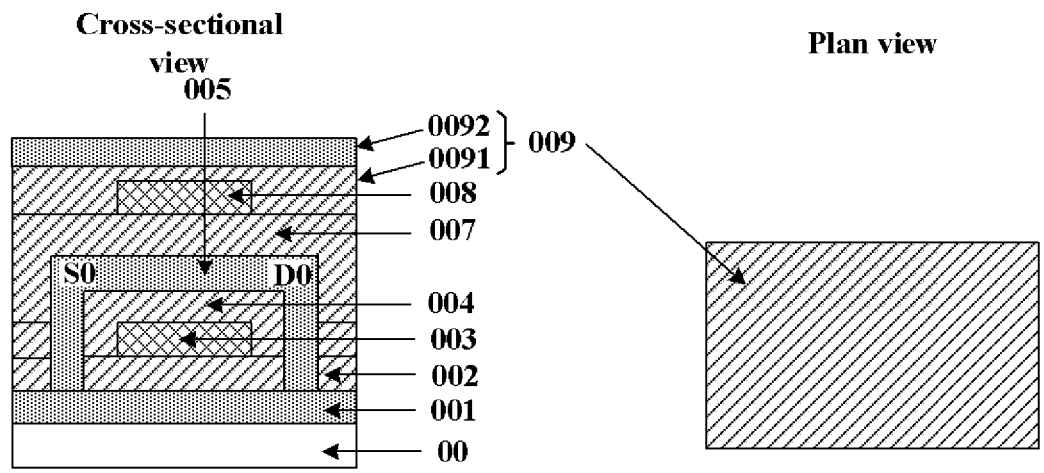
FIG. 22 is a schematic diagram having a cross-sectional view and a plan view of fourth insulating layer on a side of a shielding layer away from a base substrate in some embodiments according to the present disclosure.

FIG. 22 is a schematic diagram having a cross-sectional view and a plan view of fourth insulating layer on a side of a shielding layer away from a base substrate in some embodiments according to the present disclosure. Referring to FIG. 22, in some embodiments, the method of fabricating the thin film transistor includes forming a fourth insulating layer 009 on a side of the shielding layer 008 away from the third insulating layer 007.

Optionally, the fourth insulating layer 009 is formed using plasma enhanced chemical vapor deposition (PECVD).

Optionally, the fourth insulating layer 009 includes a first sub-insulating layer 0091 and a second sub-insulating layer 0092. Optionally, the first sub-insulating layer 0091 is formed on a side of shielding layer 008 away from the base substrate 00. Optionally, the second sub-insulating layer 0092 is formed on a side of the first sub-insulating layer 0091 away from the base substrate 00. Optionally, the first sub-insulating layer 0091 is made of silicon nitride. The second sub-insulating layer 0092 is made of silicon oxide.

Figure 23:
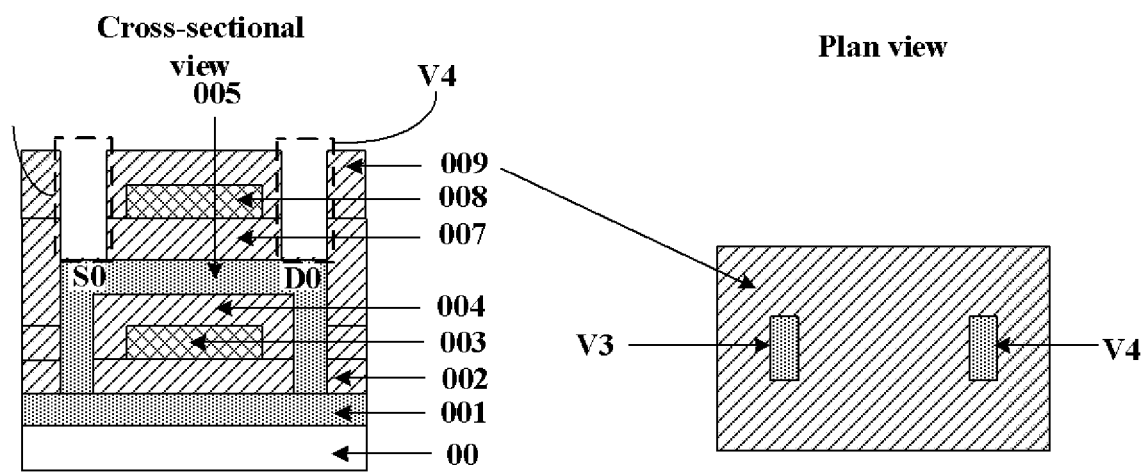
FIG. 23 is a schematic diagram having a cross-sectional view and a plan view of one or more vias extending through a third insulating layer and a fourth insulating layer in some embodiments according to the present disclosure.

FIG. 23 is a schematic diagram having a cross-sectional view and a plan view of one or more vias extending through a third insulating layer and a fourth insulating layer in some embodiments according to the present disclosure. Referring to FIG. 23, in some embodiments, the method of fabricating the thin film transistor includes forming one or more vias extending through the third insulating layer 007 and the fourth insulating layer 009. Optionally, the one or more vias extends through the third insulating layer 007 and the fourth insulating layer 009 to partially expose a surface of the second target layer 005 away from the base substrate 00.

Optionally, forming one or more vias includes forming a third via V3 and a fourth via V4 respectively extending through both the third insulating layer 007 and the fourth insulating layer 009. Optionally, the shielding layer 008 is between the third via V3 and the fourth via V4. Optionally, the third via V3 and the fourth via V4 are symmetrically arranged with respect to the shielding layer 008.

Referring to FIG. 7, in some embodiments, the method of fabricating the thin film transistor includes forming a source electrode 0061 and a drain electrode 0062 on a side of the fourth insulating layer 009 away from the shielding layer 008. Optionally, the source electrode 0061 is electrically connected to the second target layer 005. Optionally, the drain electrode 0062 is electrically connected to the second target layer 005.

Optionally, the source electrode, the drain electrode, and the gate electrode includes a same materials. Various appropriate materials may be used for making the source electrode and the drain electrode. Examples of materials suitable for making the source electrode and the drain electrode include, but are not limited to, molybdenum, molybdenum-niobium alloy, aluminum, aluminum-niobium alloy, titanium, and copper.

Optionally, the source electrode and the drain electrode are formed on the base substrate 00 prior to forming the first target layer. The first target layer is formed on a side of the source electrode and the drain electrode away from the base substrate. Optionally, the source electrode and the drain electrode are electrically connected to the first target layer.

In some embodiments, the thin film transistor is formed to have the intermediate layer being the gate electrode, the first target layer and the second target layer together constituting the active layer. During the process of fabricating this thin film transistor, four times of ion doping steps should be performed.

In some embodiments, the present disclosure provides a method of fabricating a thin film transistor whose intermediate layer is an active layer. For example, the intermediate layer of the thin film transistor is formed to be the active layer. The first target layer and the second target layer are formed to constitute a gate electrode.

Figure 24:
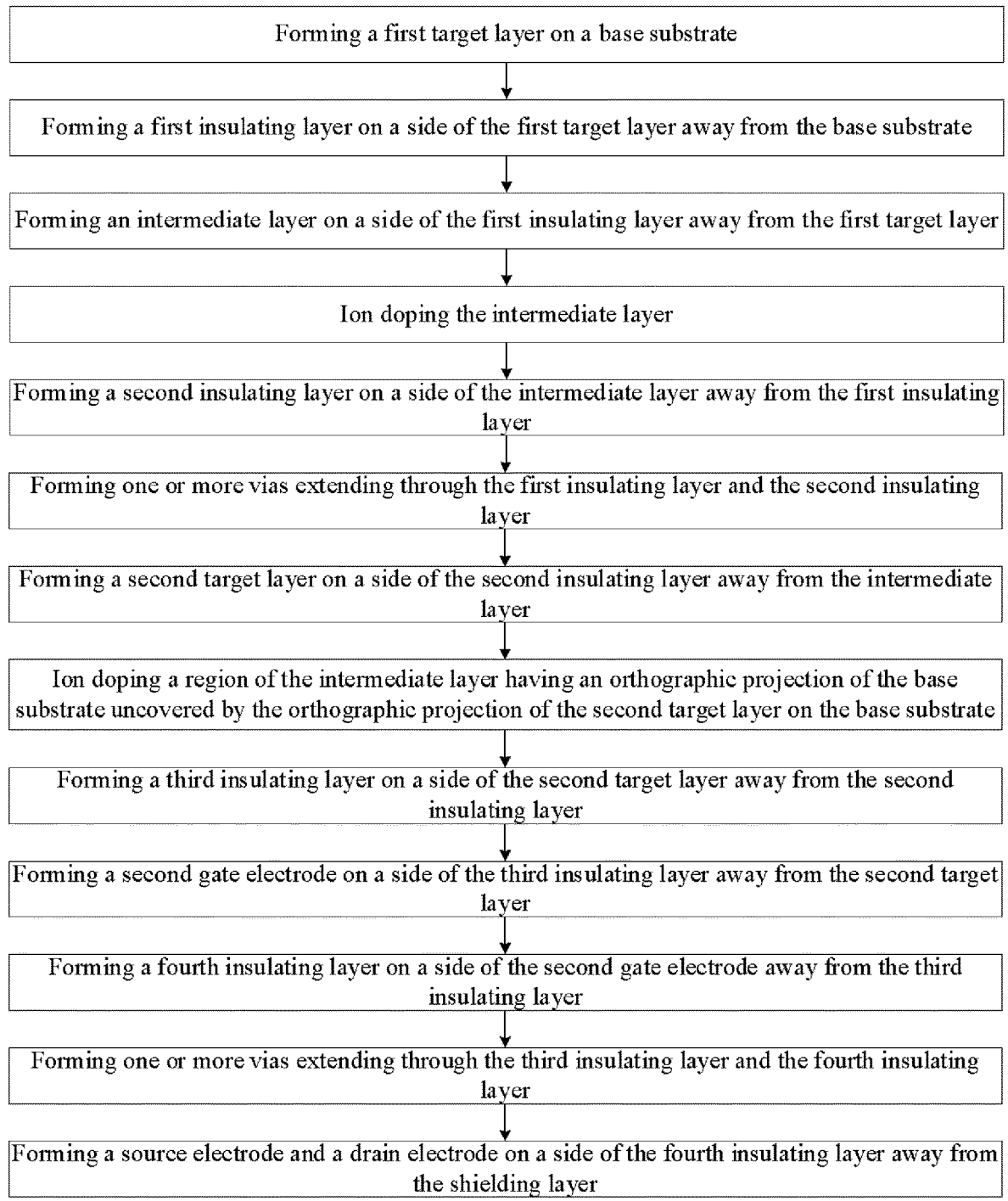
FIG. 24 is a flow chart illustrating a method of fabricating a thin film transistor in some embodiments according to the present disclosure.

FIG. 24 is a flow chart illustrating a method of fabricating a thin film transistor in some embodiments according to the present disclosure. Referring to FIG. 24, a method of fabricating a thin film transistor includes forming a first target layer on a base substrate; forming a first insulating layer on a side of the first target layer away from the base substrate; forming an intermediate layer on a side of the first insulating layer away from the first target layer; performing ion doping to the intermediate layer; forming a second insulating layer on a side of the intermediate layer away from the first insulating layer; forming one or more vias extending through the first insulating layer and the second insulating layer; forming a second target layer on a side of the second insulating layer away from the intermediate layer; performing ion doping to a region of the intermediate layer having an orthographic projection on the base substrate uncovered by the orthographic projection of the second target layer on the base substrate; forming a third insulating layer on a side of the second target layer away from the second insulating layer; forming a third gate electrode on a side of the third insulating layer away from the second target layer; forming a fourth insulating layer on a side of the third gate electrode away from the third insulating layer; forming one or more vias extending through the third insulating layer and the fourth insulating layer; and forming a source electrode and a drain electrode on a side of the fourth insulating layer away from the shielding layer.

Figure 25:
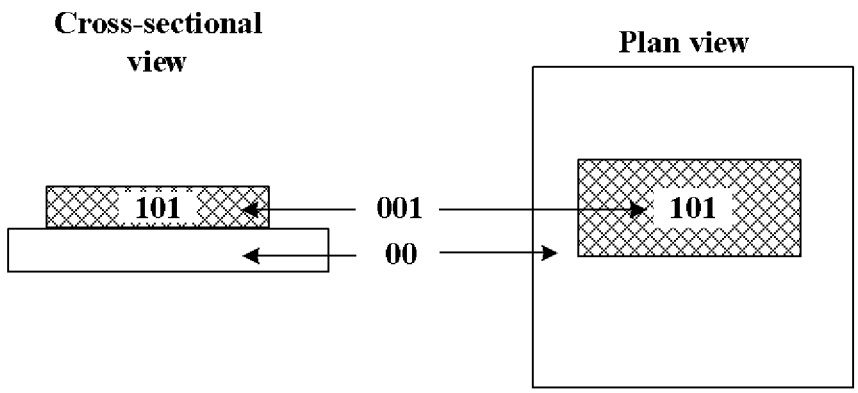
FIG. 25 is a schematic diagram having a cross-sectional view and a plan view of a first target layer formed on a base substrate in some embodiments according to the present disclosure.

FIG. 25 is a schematic diagram having a cross-sectional view and a plan view of a first target layer formed on a base substrate in some embodiments according to the present disclosure. Referring to FIG. 25, in some embodiments, the method of fabricating the thin film transistor includes forming a first target layer 001 on a base substrate 00.

Optionally, the first target layer 001 is formed by depositing a first target material layer 101 including one or more metals with low resistance on the base substrate 00; and patterning the first target material layer 101 to form the first target layer 001.

Various appropriate methods may be used for forming the first target material layer 101. Examples of methods suitable for forming the first target material layer 101 include, but are not limited to, physical vapor deposition method such as magnetron sputtering.

Various appropriate methods may be used for patterning the first target material layer 101. Examples of method suitable for patterning the first target material layer 101 include, but are not limited to, lithography process.

Various appropriate materials may be used for forming the first target material layer 101. Examples of materials suitable for forming the first target material layer 101 include, but are not limited to, metals or alloys. Optionally, metals suitable for making the first target material layer 101 include, but are not limited to, Molybdenum (Mo), aluminum (Al), chromium (Cr), copper (Cu), and titanium (Ti). Optionally, alloys suitable for making the first target material layer 101 include, but are not limited to, aluminum-nickel alloy. Optionally, the first target material layer 101 is formed by a single-layer metal film or signal-layer alloy film. Optionally, the first target material layer 101 is formed by a multi-layer metal film. In one example, the multi-layer metal film is made of a Molybdenum (Mo) film, an aluminum (Al) film, and a Molybdenum (Mo) film sequentially stacked together. In another example, the multi-layer metal film is made of a titanium (Ti) film, an aluminum (Al) film, and a titanium (Ti) film sequentially stacked together.

Figure 26:
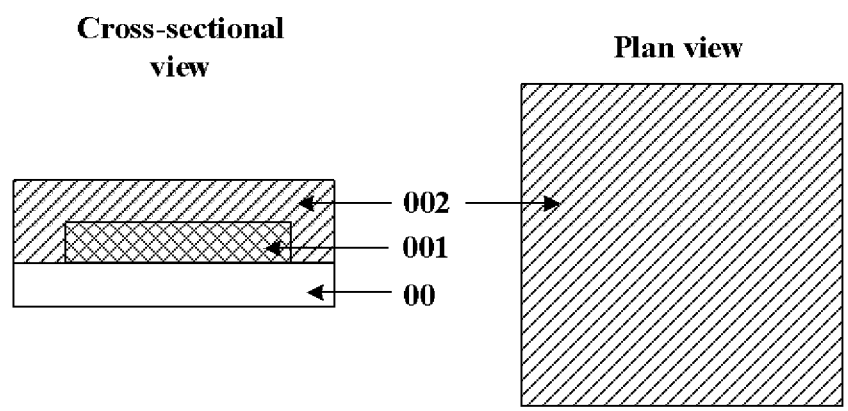
FIG. 26 is a schematic diagram having a cross-sectional view and a plan view of a first insulating layer formed on a side of a first target layer away from a base substrate in some embodiments according to the present disclosure.

FIG. 26 is a schematic diagram having a cross-sectional view and a plan view of a first insulating layer formed on a side of a first target layer away from a base substrate in some embodiments according to the present disclosure. Referring to FIG. 26, in some embodiments, the method of fabricating the thin film transistor includes forming a first insulating layer 002 on a side of the first target layer 001 away from the base substrate 00.

Various appropriate materials may be used for making the first insulating layer 002. Examples of materials suitable for making the first insulating layer 002 include, but are not limited to, insulating materials such as silicon oxide and silicon nitride.

Optionally, the first insulating layer 002 is formed using plasma enhanced chemical vapor deposition (PECVD).

Figure 27:
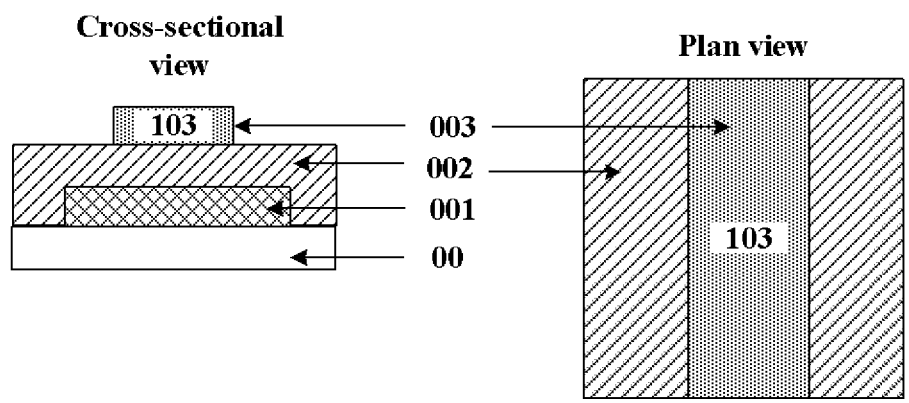
FIG. 27 is a schematic diagram having a cross-sectional view and a plan view of an intermediate layer on a side of a first insulating layer away from a base substrate in some embodiments according to the present disclosure.

FIG. 27 is a schematic diagram having a cross-sectional view and a plan view of an intermediate layer on a side of a first insulating layer away from a base substrate in some embodiments according to the present disclosure. Referring to FIG. 27, in some embodiments, the method of fabricating the thin film transistor includes forming an intermediate layer 003 on a side of the first insulating layer 002 away from the first target layer 001.

Optionally, the intermediate layer is the active layer. Various appropriate materials may be used for making the active layer. Examples of materials suitable for making the active layer include, but are not limited to, poly crystalline silicon materials, metal oxide materials, and amorphous silicon materials. Optionally, the poly crystalline silicon materials include, but are not limited to, low temperate poly crystalline silicon. Optionally, the metal oxide materials include, but are not limited to, indium gallium zinc oxide (IGZO) or zinc oxide (ZnO).

Optionally, forming the intermediate layer includes depositing an intermediate material layer 103 on the base substrate; and patterning the intermediate material layer 103 using a lithography process to form the active layer.

Various methods may be used for forming the intermediate material layer 103. Examples of methods suitable for forming the intermediate material layer 103 include, but are not limited to, sputtering, thermal evaporation, plasma enhanced chemical vapor deposition (PECVD), low pressure chemical vapor deposition (LPCVD), atmospheric pressure chemical vapor deposition (APCVD), electron cyclotron resonance chemical vapor deposition (ECR-CVD).

Various method may be included in the lithography process for patterning the intermediate material layer 103. Examples of methods in the lithography process for patterning the intermediate material layer 103 include, but are not limited to, photoresist coating, exposing, developing, etching, and stripping the photoresist.

Figure 28:
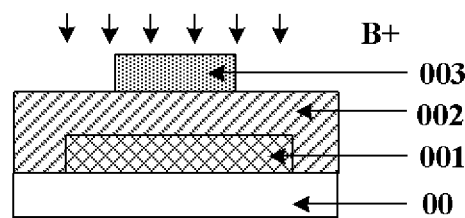
FIG. 28 is a schematic diagram illustrating an ion doping process performed on an intermediate layer in some embodiments according to the present disclosure.

FIG. 28 is a schematic diagram illustrating an ion doping process performed on an intermediate layer in some embodiments according to the present disclosure. Referring to FIG. 28, in some embodiments, the method of fabricating the thin film transistor includes performing ion doping to the intermediate layer 003.

By ion doping the intermediate layer 003, a threshold voltage of a channel region of an active layer to be formed by patterning the intermediate layer 003 can be adjusted. Optionally, a relatively small number of ion is doped in the intermediate layer 003. For example, boron ions are doped in the intermediate layer 003. The number of boron ions doped in the intermediate layer 003 is $10^{12}$.

Figure 29:
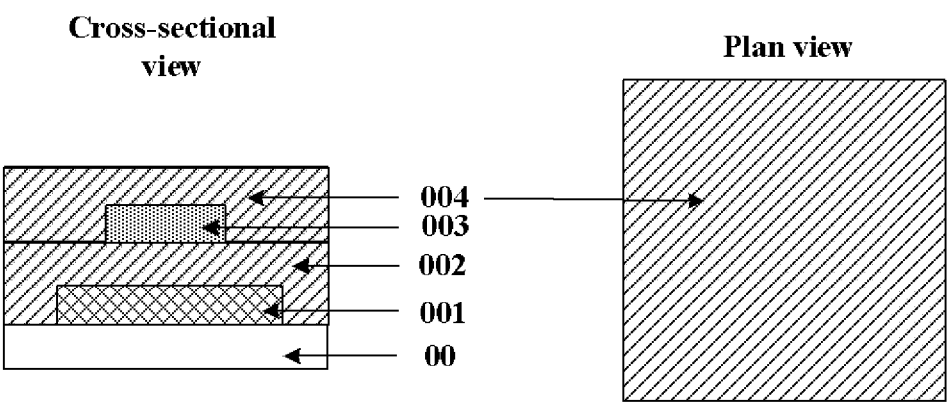
FIG. 29 is a schematic diagram having a cross-sectional view and a plan view of a second insulating layer on a side of an intermediate layer away from a base substrate in some embodiments according to the present disclosure.

FIG. 29 is a schematic diagram having a cross-sectional view and a plan view of a second insulating layer on a side of an intermediate layer away from a base substrate in some embodiments according to the present disclosure. Referring to FIG. 29, in some embodiments, the method of fabricating the thin film transistor includes forming a second insulating layer 004 on a side of the intermediate layer 003 away from the first insulating layer 002.

Optionally, the second insulating layer 004 is formed using plasma enhanced chemical vapor deposition (PECVD). Optionally, the second insulating layer 004 and the first insulating layer 002 includes a same material.

Figure 30:
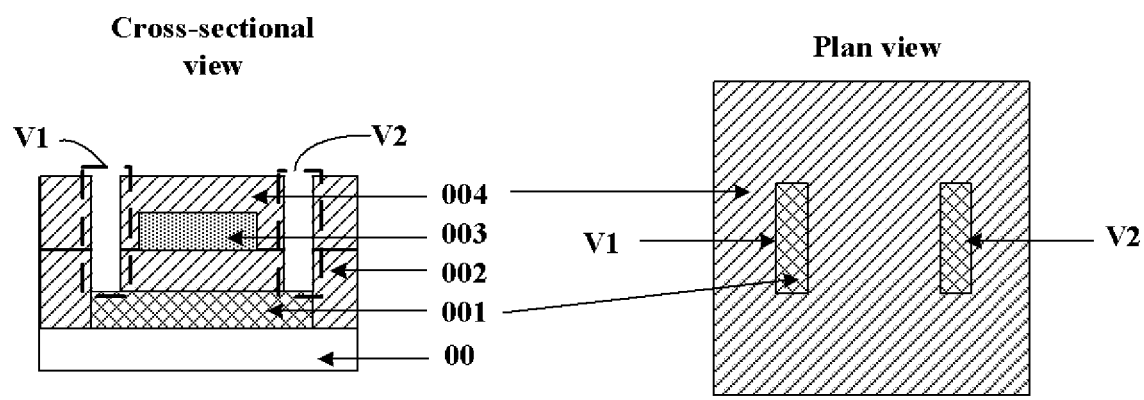
FIG. 30 is a schematic diagram having a cross-sectional view and a plan view of one or more vias extending through a first insulating layer and a second insulating layer in some embodiments according to the present disclosure.

FIG. 30 is a schematic diagram having a cross-sectional view and a plan view of one or more vias extending through a first insulating layer and a second insulating layer in some embodiments according to the present disclosure. Referring to FIG. 30, in some embodiments, the method of fabricating the thin film transistor includes forming one or more vias extending through the first insulating layer 002 and the second insulating layer 004. Optionally, the one or more vias extends through the first insulating layer 002 and the second insulating layer 004 to partially expose a surface of the first target layer 001 away from the base substrate 00.

Optionally, forming one or more vias includes forming a first via V1 and a second via V2 respectively extending through both the first insulating layer 002 and the second insulating layer 004. Optionally, the intermediate layer 003 is between the first via V1 and the second via V2. Optionally, the first via V1 and the second via V2 are symmetrically arranged with respect to the intermediate layer 003.

Figure 31:
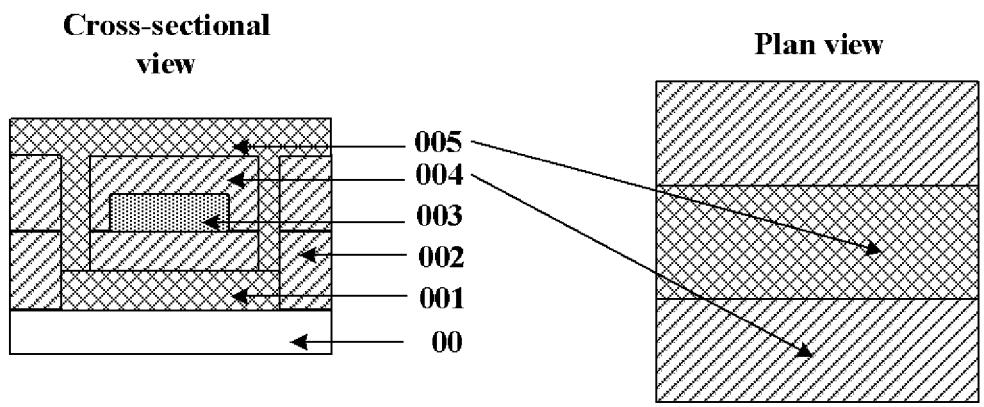
FIG. 31 is a schematic diagram having a cross-sectional view and a plan view of a second target layer formed on a side of a second insulating layer away from a base substrate in some embodiments according to the present disclosure.

FIG. 31 is a schematic diagram having a cross-sectional view and a plan view of a second target layer formed on a side of a second insulating layer away from a base substrate in some embodiments according to the present disclosure. Referring to FIG. 31, in some embodiments, the method of fabricating the thin film transistor includes forming a second target layer 005 on a side of the second insulating layer 004 away from the intermediate layer 003.

Optionally, the second target layer 005 plays a same role as a first target layer 001. For example, the first target layer 001 and the second target layer 005 together constitute the gate electrode.

Optionally, the first target layer 001 is electrically connected to the second target layer 005. For example, the first target layer 001 is electrically connected to the second target layer 005 through the one or more vias extending through the first insulating layer 002 and the second insulating layer 004.

Optionally, an orthographic projection of the intermediate layer 003 on the base substrate 00 at least partially overlaps with an orthographic projection of the first target layer 001 on the base substrate 00. Optionally, the orthographic projection of the intermediate layer 003 on the base substrate 00 at least partially overlaps with an orthographic projection of the second target layer 005 on the base substrate 00.

Optionally, the orthographic projection of the intermediate layer 003 on the base substrate 00 is covered by the orthographic projection of the first insulating layer 002 on the base substrate 00. Optionally, the orthographic projection of the intermediate layer 003 on the base substrate 00 is covered by the orthographic projection of the second insulating layer 004 on the base substrate 00.

Figure 32:
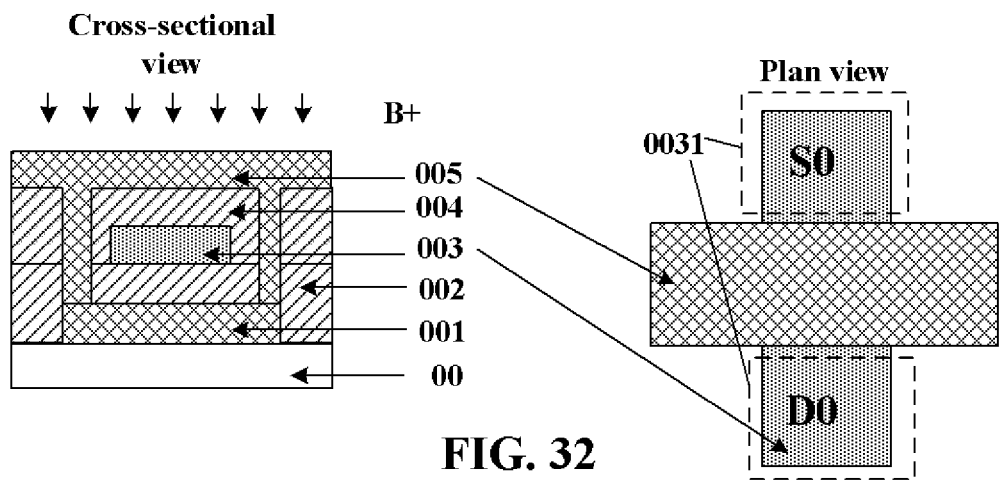
FIG. 32 is a schematic diagram illustrating an ion doping process performed on a region of an intermediate layer having an orthographic projection on a base substrate uncovered by an orthographic projection of a second target layer on the base substrate in some embodiments according to the present disclosure.

FIG. 32 is a schematic diagram illustrating an ion doping process performed on a region of an intermediate layer having an orthographic projection on a base substrate uncovered by an orthographic projection of a second target layer on the base substrate in some embodiments according to the present disclosure. Referring to FIG. 32, the plan view in FIG. 32 shows the second target layer 005 and the intermediate layer 003. In some embodiments, the method of fabricating the thin film transistor includes performing ion doping to a region 0031 (e.g. the source electrode contacting region S0 and the drain electrode contracting region D0) of the intermediate layer 003 having an orthographic projection on the base substrate 00 uncovered by the orthographic projection of the second target layer 005 on the base substrate 00.

By covering the channel region of the intermediate layer 003 using the second target layer 005, it is more convenient to dope ion on an region 0031 (e.g. the source electrode contacting region S0 and the drain electrode contracting region D0) of the intermediate layer 003 other than the channel region of the intermediate layer 003, to enhance the conductivity of the source electrode contacting region S0 and the resistance of the drain electrode contracting region D0 of the intermediate layer 003.

Optionally, a relatively large number of ions can be doped in the region 0051 of the intermediate layer 003. For example, boron ions are doped in the region 0051 (e.g. the source electrode contacting region S0 and the drain electrode contracting region D0) of the intermediate layer 003. The number of boron ions doped in the region 0051 (e.g. the source electrode contacting region S0 and the drain electrode contracting region D0) of the intermediate layer 003 is $10^{14}$.

Figure 33:
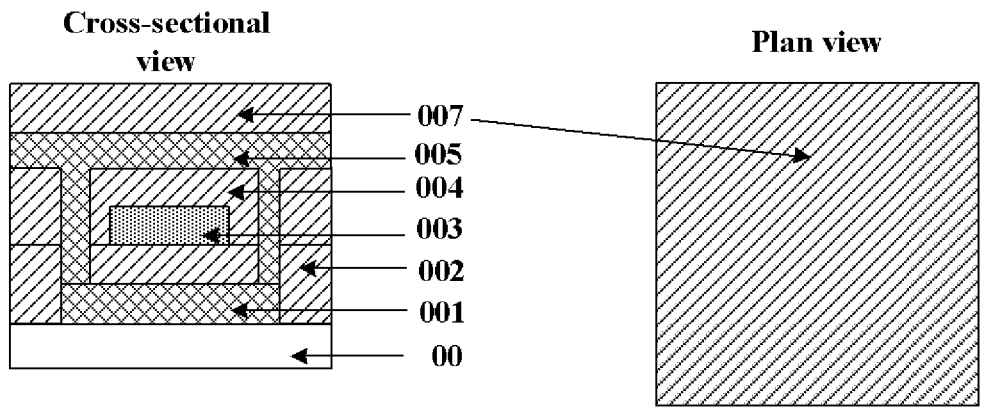
FIG. 33 is a schematic diagram having a cross-sectional view and a plan view of a third insulating layer on a side of a second target layer away from a base substrate in some embodiments according to the present disclosure.

FIG. 33 is a schematic diagram having a cross-sectional view and a plan view of a third insulating layer on a side of a second target layer away from a base substrate in some embodiments according to the present disclosure. Referring to FIG. 33, in some embodiments, the method of fabricating the thin film transistor includes forming a third insulating layer 007 on a side of the second target layer 005 away from the second insulating layer 004.

Optionally, the third insulating layer 007 is formed using plasma enhanced chemical vapor deposition (PECVD).

Optionally, the third insulating layer 007 and the first insulating layer 002 includes a same materials. For example, the second insulating layer 004 and the first insulating layer 002 are made of silicon nitride. Optionally, the third insulating layer 007 is made of a material different from the one of first insulating layer 002. For example, the third insulating layer 007 is made of silicon nitride, and the first insulating layer 002 is made of silicon oxide.

Figure 34:
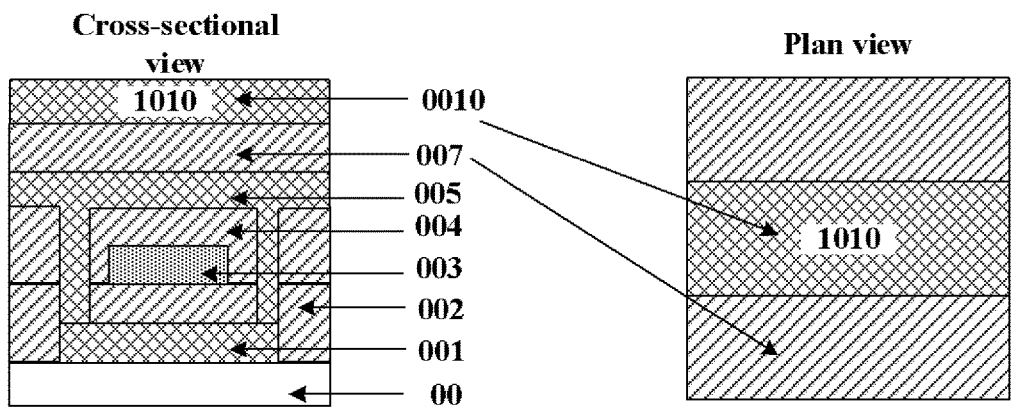
FIG. 34 is a schematic diagram having a cross-sectional view and a plan view of a second gate electrode on a side of a third insulating layer away from a base substrate in some embodiments according to the present disclosure.

FIG. 34 is a schematic diagram having a cross-sectional view and a plan view of a second gate electrode on a side of a third insulating layer away from a base substrate in some embodiments according to the present disclosure. Referring to FIG. 34, in some embodiments, the method of fabricating the thin film transistor includes forming a second gate electrode 0010 on a side of the third insulating layer 007 away from the second target layer 005.

Optionally, forming the second gate electrode 0010 includes forming a second gate electrode material layer 1010 having one or more metals with low resistance on the side of the third insulating layer 007 away from the base substrate 00; and patterning the second gate electrode material layer 1010 to form the second gate electrode 0010 using lithographic process.

Various appropriate materials may be used for forming the second gate electrode material layer 1010. Examples of materials suitable for making the second gate electrode material layer 1010 include, but are not limited to, metals or alloys. Optionally, metals suitable for making the intermediate material layer 103 include, but are not limited to, Molybdenum (Mo), aluminum (Al), chromium (Cr), copper (Cu), and titanium (Ti). Optionally, alloys suitable for making the second gate electrode material layer 1010 include, but are not limited to, aluminum-nickel alloy. Optionally, the second gate electrode material layer 1010 is formed by a single-layer metal film or signal-layer alloy film. Optionally, the second gate electrode material layer 1010 is formed by a multi-layer metal layer.

Various appropriate methods may be used for forming the second gate electrode material layer 1010. Examples of methods suitable for forming the second gate electrode material layer 1010 include, but are not limited to, physical vapor deposition method such as magnetron sputtering.

Figure 35:
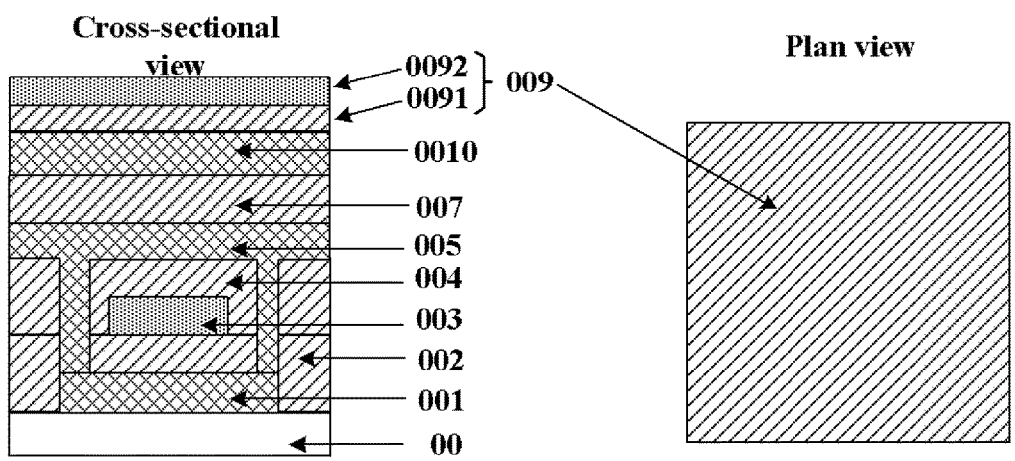
FIG. 35 is a schematic diagram having a cross-sectional view and a plan view of a fourth insulating layer on a side of a second gate electrode away from a base substrate in some embodiments according to a present disclosure.

FIG. 35 is a schematic diagram having a cross-sectional view and a plan view of a fourth insulating layer on a side of a second gate electrode away from a base substrate in some embodiments according to a present disclosure. Referring to FIG. 35, in some embodiments, the method of fabricating the thin film transistor includes forming a fourth insulating layer 009 on a side of the second gate electrode 0010 away from the third insulating layer 007.

Optionally, the fourth insulating layer 009 is formed using plasma enhanced chemical vapor deposition (PECVD).

Optionally, the fourth insulating layer 009 includes a first sub-insulating layer 0091 and a second sub-insulating layer 0092. Optionally, the first sub-insulating layer 0091 is formed on a side of the second gate electrode 0010 away from the third insulating layer 007. Optionally, the second sub-insulating layer 0092 is formed on a side of the first sub-insulating layer 0091 away from the base substrate 00. Optionally, the first sub-insulating layer 0091 is made of silicon nitride. The second sub-insulating layer 0092 is made of silicon oxide.

Figure 36:
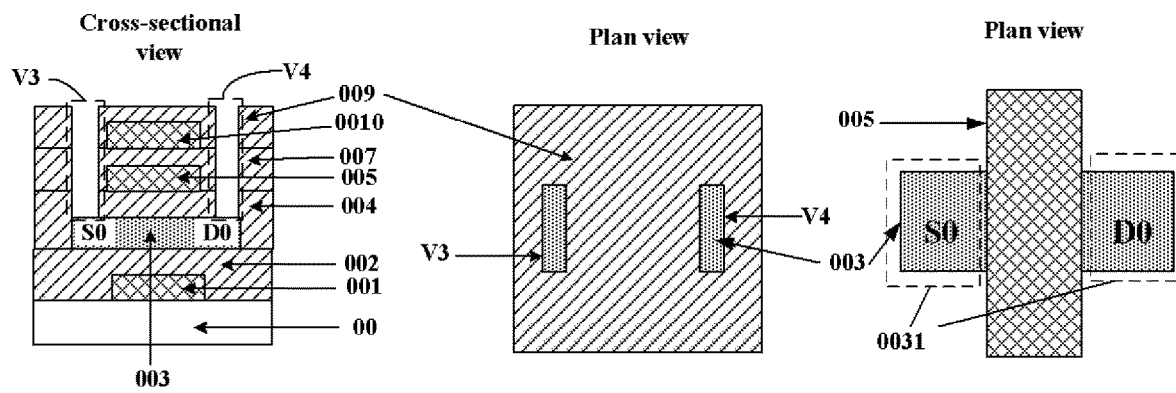
FIG. 36 is a schematic diagram having a cross-sectional view and a plan view of one or more vias extending through a third insulating layer and a fourth insulating layer in some embodiments according to the present disclosure.

FIG. 36 is a schematic diagram having a cross-sectional view and a plan view of one or more vias extending through a third insulating layer and a fourth insulating layer, and a plan view of the intermediate layer and the second target layer in some embodiments according to the present disclosure. Referring to FIG. 36, in some embodiments, the method of fabricating the thin film transistor includes forming one or more vias extending through the third insulating layer 007 and the fourth insulating layer 009. Optionally, the one or more vias extends through the third insulating layer 007 and the fourth insulating layer 009 to partially expose a surface of the second target layer 005 away from the base substrate 00.

Optionally, forming one or more vias includes forming a third via V3 and a fourth via V4 respectively extending through both the third insulating layer 007 and the fourth insulating layer 009. Optionally, the second target layer 005 is between the third via V3 and the fourth via V4. Optionally, the third via V3 and the fourth via V4 are symmetrically arranged with respect to the second target layer 005.

Referring to FIG. 8, in some embodiments, the method of fabricating the thin film transistor includes forming a source electrode 0061 and a drain electrode 0062 on a side of the fourth insulating layer 009 away from the second electrode 0010. Optionally, the source electrode 0061 is electrically connected to the intermediate layer 003. Optionally, the drain electrode 0062 is electrically connected to the intermediate layer 003.

Optionally, the source electrode, the drain electrode, and the gate electrode includes a same materials. Various appropriate materials may be used for making the source electrode and the drain electrode. Examples of materials suitable for making the source electrode and the drain electrode include, but are not limited to, molybdenum, molybdenum-niobium alloy, aluminum, aluminum-niobium alloy, titanium, and copper.

In some embodiments, the thin film transistor is formed to have the intermediate layer being the active layer, the first target layer and the second target layer together constituting the gate electrode. During the process of fabricating this thin film transistor, two times of ion doping steps should be performed.

In some embodiments, the method of fabricating the thin film transistor disclosed herein fabricating a thin film transistor having a first target layer, a first insulating layer, an intermediate layer, a second insulating layer, and a second target layer sequentially stacked on a base substrate. In some embodiments, the first target layer and the second target layer together constitute one of an active layer and a gate electrode.

In one example, the first target layer and the second target layer together constitute the active layer, to form a first channel region of the first target layer and the second channel region of the second target layer encircling the intermediate layer (e.g. the gate electrode). A width of the channel region of the thin film transistor is a value of a sum of a first channel width of the first channel region and a second channel width of the second channel region, e.g. the width of the channel region of the thin film transistor is a value of a sum of the first width of the first target layer and the second width of a second target layer. The ratio of the width of the channel region to the length of the channel region can maintain in a relative greater value, even though the first width of the first target layer or the second width of the second target layer is reduced. By reducing the first width of the first target layer or the second width of the second target layer, the size of thin film transistor in a plane parallel to the base substrate is reduced without weakening the driving capacity of the thin film transistor.

In another example, the first target layer and the second target layer together constitute the gate electrode, to encircle the intermediate layer (e.g. the active layer), resulting the active layer between two gate sub-electrodes of the gate electrode. The two gate sub-electrodes (e.g. the first target layer and the second target layer) together drive the active layer, which may enhance the driving capacity of the thin film transistor.

In some embodiments, the thin film transistor described herein can enhance the driving capacity without increasing the size of thin film transistor in a plane parallel to the base substrate, and the thin film transistor described herein can be used to fabricate a display apparatus having a narrow frame and high resolution.

In another aspect, the present disclosure also provides a display substrate having the thin film transistor described herein or fabricated by a method described herein. In some embodiments, the display substrate includes a base substrate, the thin film transistor described herein or fabricated by a method described herein. Optionally, the display substrate is an array substrate including a plurality of signal lines such as a plurality of gate lines and a plurality of data lines.

The size of thin film transistor described herein or fabricated by a method described herein in a plane parallel to the base substrate 00 is relatively smaller, the space of the thin film transistor occupied on the base substrate is relatively smaller, which may increase the space utilization of the base substrate.

In another aspect, the present disclosure also provides a display apparatus. In some embodiment, a display apparatus having a thin film transistor includes a display substrate having a thin film transistor described herein or fabricated by a method described herein; and one or more integrated circuits connected to the display panel. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A thin film transistor, comprising:
a base substrate;
a first target layer on the base substrate, the first target layer having a first length along a first direction and a first width along a second direction;
a first insulating layer on a side of the first target layer away from the base substrate;
an intermediate layer on a side of the first insulating layer away from the first target layer, the intermediate layer having a third width along the first direction, and a third length along the second direction;
a second insulating layer on a side of the intermediate layer away from the first insulating layer; and
a second target layer on a side of the second insulating layer away from the intermediate layer, the second target layer having a second length along the first direction and a second width along the second direction;
wherein the first target layer is electrically connected to the second target layer;
an orthographic projection of the intermediate layer on the base substrate at least partially overlaps with an orthographic projection of the first target layer on the base substrate;
the orthographic projection of the intermediate layer on the base substrate at least partially overlaps with an orthographic projection of the second target layer on the base substrate;
the intermediate layer is one of a gate electrode and an active layer, and the first target layer and the second target layer together constitute another one of the gate electrode and the active layer; and
the third width is smaller than the first width and smaller than the second width,
wherein the first direction is a direction along which the first target layer and the second target layer cross over the intermediate layer, and parallel to a shorter side of the orthographic projection of the intermediate layer on the base substrate; and
the second direction is a direction along which the intermediate layer crosses over the first target layer and the second target layer, and parallel to a shorter side of the orthographic projection of the first target layer on the base substrate or a shorter side of the orthographic projection of the second target layer on the base substrate.

2. The thin film transistor of claim 1, wherein
the orthographic projection of the intermediate layer on the base substrate is covered by the orthographic projection of the first insulating layer on the base substrate; and
the orthographic projection of the intermediate layer on the base substrate is covered by the orthographic projection of the second insulating layer on the base substrate.

3. The thin film transistor of claim 1, further comprising one or more vias extending through both the first insulating layer and the second insulating layer;
wherein the first target layer is electrically connected to the second target layer through the one or more vias.

4. The thin film transistor of claim 3, wherein the one or more vias comprises a first via and a second via respectively extending through both the first insulating layer and the second insulating layer;
wherein the intermediate layer is between the first via and the second via; and
the first via and the second via are symmetrically arranged with respect to the intermediate layer.

5. The thin film transistor of claim 3, wherein the second target layer comprises a first portion and a second portion;
the second portion of the second target layer is in the one or more vias; and the first portion of the second target layer and the first target layer respectively have a bar shape extending along a first direction.

6. The thin film transistor of claim 5, wherein the intermediate layer has a bar shape extending along the first direction or a second direction that is perpendicular to the first direction.

7. The thin film transistor of claim 1, wherein the second width is smaller than the first width.

8. The thin film transistor of claim 7, wherein
the intermediate layer is the gate electrode; and
the first target layer and the second target layer together constitute the active layer.

9. The thin film transistor of claim 1,
wherein the intermediate layer is the gate electrode; and the first target layer and the second target layer are the active layer; and
wherein the thin film transistor further comprises a source electrode electrically connected to one of the first target layer and the second target layer, and a drain electrode electrically connected to one of the first target layer and second target layer.

10. The thin film transistor of claim 1,
wherein the intermediate layer is the active layer; and
the first target layer and the second target layer together constitute the gate electrode;
wherein the thin film transistor further comprises a source electrode and a drain electrode both electrically connected to the intermediate layer.

11. A display apparatus having a thin film transistor, comprising a display substrate having a thin film transistor of claim 1.

12. A method of fabricating a thin film transistor, comprising
forming a first target layer on a base substrate, the first target layer having a first length along a first direction and a first width along a second direction;
forming a first insulating layer on a side of the first target layer away from the base substrate;
forming an intermediate layer on a side of the first insulating layer away from the first target layer, the intermediate layer having a third width along the first direction, and a third length along the second direction;
forming a second insulating layer on a side of the intermediate layer away from the first insulating layer; and
forming a second target layer on a side of the second insulating layer away from the intermediate layer, the second target layer having a second length along the first direction and a second width along the second direction;
wherein the first target layer is electrically connected to the second target layer;
an orthographic projection of the intermediate layer on the base substrate at least partially overlaps with an orthographic projection of the first target layer on the base substrate;
the orthographic projection of the intermediate layer on the base substrate at least partially overlaps with an orthographic projection of the second target layer on the base substrate;
the intermediate layer is one of a gate electrode and an active layer, and the first target layer and the second target layer constitute another one of the gate electrode and the active layer; and
the third width is smaller than the first width and smaller than the second width;

wherein the first direction is a direction along which the first target layer and the second target layer cross over the intermediate layer, and parallel to a shorter side of the orthographic projection of the intermediate layer on the base substrate; and
the second direction is a direction along which the intermediate layer crosses over the first target layer and the second target layer, and parallel to a shorter side of the orthographic projection of the first target layer on the base substrate or a shorter side of the orthographic projection of the second target layer on the base substrate.

13. The method of claim 12, wherein
the orthographic projection of the intermediate layer on the base substrate is covered by the orthographic projection of the first insulating layer on the base substrate; and
the orthographic projection of the intermediate layer on the base substrate is covered by the orthographic projection of the second insulating layer on the base substrate.

14. The method of claim 12, prior to forming the second target layer, further comprising forming one or more vias extending through both the first insulating layer and the second insulating layer to partially expose a surface of the first target layer away from the base substrate;
wherein the second target layer is formed on the side of the second insulating layer away from the first insulating layer; and
the second target layer is formed to extend through the first insulating layer and the second insulating layer through the one or more vias to connect to the first target layer.

15. The method of claim 14, wherein forming the one or more vias comprises forming a first via and a second via respectively extending through both the first insulating layer and the second insulating layer;
the intermediate layer is between the first via and the second via; and
the first via and the second via are symmetrically arranged with respect to the intermediate layer.

16. The method of claim 12, wherein the intermediate layer is the gate electrode; and the first target layer and the second target layer together constitute the active layer;
wherein the method further comprises:
performing ion doping to the first target layer;
subsequent to forming the intermediate layer, performing ion doping to a region of the first target layer having an orthographic projection on the base substrate uncovered by the orthographic projection of the intermediate layer on the base substrate; and
performing ion doping to the second target layer.

17. The method of claim 16, subsequent to performing ion doping to the second target layer, further comprising
forming a third insulating layer on a side of the second target layer away from the second insulating layer;
forming a shielding layer on a side of the third insulating layer away from the second target layer, an orthographic projection of the shielding layer on the base substrate substantially overlapping the orthographic projection of the intermediate layer; and
performing ion doping to a region of the second target layer having an orthographic projection on the base substrate uncovered by the orthographic projection of the shielding layer on the base substrate.

18. The method of claim 12, wherein the intermediate layer is the active layer; and the first target layer and the second target layer together constitute the gate electrode;
   wherein the method further comprises:
   performing ion doping to the intermediate layer; and
   subsequent to forming the second target layer, performing ion doping to a region of the intermediate layer having an orthographic projection on the base substrate uncovered by the orthographic projection of the second target layer on the base substrate.

19. The method of claim 12, wherein the intermediate layer is the gate electrode; and the first target layer and the second target layer together constitute the active layer;
   wherein the method further comprises:
   forming a source electrode electrically connected to one of the first target layer and the second target layer; and
   forming a drain electrode electrically connected to one of the first target layer and the second target layer.

20. The method of claim 12, wherein the intermediate layer is the active layer; and the first target layer and the second target layer together constitute the gate electrode;
   wherein the method further comprises
   forming a source electrode and a drain electrode both electrically connected to the intermediate layer.

* * * * *